(12) United States Patent
Sumida

(10) Patent No.: US 11,777,249 B2
(45) Date of Patent: Oct. 3, 2023

(54) ELECTRICAL CONNECTION BOX WITH A WATERPROOF MEMBER

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Tatsuya Sumida, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/816,262

(22) Filed: Jul. 29, 2022

(65) Prior Publication Data

US 2022/0368067 A1 Nov. 17, 2022

Related U.S. Application Data

(63) Continuation of application No. 17/252,365, filed as application No. PCT/JP2019/019049 on May 14, 2019, now Pat. No. 11,611,171.

(30) Foreign Application Priority Data

Jun. 19, 2018 (JP) .................................. 2018-115945

(51) Int. Cl.
*H01R 13/52* (2006.01)
*H01R 13/627* (2006.01)
(Continued)

(52) U.S. Cl.
CPC ..... *H01R 13/5202* (2013.01); *H01R 13/6272* (2013.01); *H05K 5/0069* (2013.01);
(Continued)

(58) Field of Classification Search
CPC .. H01R 13/5202; H01R 13/6272; H05K 5/06; H05K 5/061; H05K 5/069; B60R 16/0239
See application file for complete search history.

(56) References Cited

U.S. PATENT DOCUMENTS 5,264,661 A * 11/1993 Luettgen ............. B60R 16/0239
174/539
8,545,238 B2 10/2013 Takeda et al.
(Continued)

*Primary Examiner* — Oscar C Jimenez
(74) *Attorney, Agent, or Firm* — Honigman LLP

(57) ABSTRACT

An electrical connection box is provided with a connector-attached board and a shield case that internally houses the connector-attached board. The connector-attached board is provided with a circuit board, a connector that is fixed to the circuit board and that engages with a mating connector, and an attachment that is attached to the connector. The shield case surrounds the circuit board and is provided with an upper short wall portion and a lower short wall portion that include a connector opening for facing the connector outside. The attachment is provided with a waterproof portion that covers the periphery of an engagement surface of the connector that faces the mating connector, and the waterproof portion is provided with a waterproof wall that covers the periphery of the connector and the mating connector.

8 Claims, 28 Drawing Sheets

(51) Int. Cl.
*H05K 5/00* (2006.01)
*H05K 5/06* (2006.01)
*B60R 16/023* (2006.01)

(52) U.S. Cl.
CPC .......... *H05K 5/061* (2013.01); *B60R 16/0239* (2013.01); *H05K 5/0052* (2013.01)

(56) References Cited

U.S. PATENT DOCUMENTS

| | | |
|---|---|---|
| 9,653,853 B2 | 5/2017 | Ohtani |
| 10,785,882 B2 | 9/2020 | Tsujiya et al. |
| 10,798,835 B2 | 10/2020 | Takeda et al. |
| 11,611,171 B2 * | 3/2023 | Sumida ................ H05K 5/0069 |
| 2010/0099279 A1 * | 4/2010 | Homme ................ H05K 5/069 |
| | | 439/78 |
| 2012/0276761 A1 * | 11/2012 | Martin ................ H01R 12/724 |
| | | 29/829 |
| 2015/0099385 A1 * | 4/2015 | Ikeya .................... H01R 12/75 |
| | | 439/271 |
| 2015/0132977 A1 | 5/2015 | Kanou et al. |
| 2015/0351262 A1 * | 12/2015 | Jorgensen ............ H05K 5/0043 |
| | | 312/223.1 |
| 2017/0257959 A1 | 9/2017 | Ogitani |
| 2021/0273371 A1 * | 9/2021 | Sumida ............. H01R 13/6272 |
| 2022/0247106 A1 * | 8/2022 | Makino ................ H01R 12/724 |
| 2022/0336993 A1 * | 10/2022 | Alcarria Grande ......................... H01R 13/4532 |

\* cited by examiner

ELECTRICAL CONNECTION BOX WITH A WATERPROOF MEMBER

CROSS-REFERENCE TO RELATED APPLICATIONS

This application is a continuation of U.S. application Ser. No. 17/252,365, filed Dec. 15, 2020, which is a U.S. national stage of PCT/JP2019/019049 filed on May 14, 2019, which claims priority of Japanese Patent Application No. JP 2018-115945 filed on Jun. 19, 2018, the contents of which are incorporated herein.

TECHNICAL FIELD

The technology disclosed by the present specification relates to an electrical connection box.

BACKGROUND

Known electrical connection boxes installed in a vehicle that supplies power to various in-vehicle electrical components and control power supply are provided with a circuit board, a connect connected to the circuit board, and a case that internally houses a circuit board and includes an opening where a connect faces outside (see JP 2017-79547A). Of such electrical connection boxes, electrical connection boxes that are used installed in a vehicle cabin are not required to have a highly waterproof structure like electrical connection boxes installed in an engine room, with a waterproof structure able to prevent water from entering side in the case of being splashed with about a cup of water being sufficient.

Compared to a connector with a simple waterproof structure sufficient for its needs, developing a dedicated connector with a waterproof structure involves a high cost. Thus, there is a demand for a low cost and simple waterproof structure.

SUMMARY

An electrical connection box disclosed by the present specification includes: a connector-attached board provided with a circuit board and a connector fixed to the circuit board that engages with a mating connector; a waterproof member attached to the connector-attached board; and a case that internally houses the connector attached board. The case surrounds the circuit board and is provided with a case side wall that includes an opening portion for facing the connector outside; and the waterproof member is provided with a waterproof portion covering a periphery of an engagement surface of the connector facing the mating connector. The waterproof portion is provided with a waterproof wall covering a periphery of the connector or the mating connector.

According to the configuration described above, the waterproof member, formed as a separate member, is attached to the connector. Thus, there is no need to develop a dedicated connector with a waterproof structure, and waterproofing can be achieved simply and at a low cost.

In the configuration described above, the waterproof wall may project outside the case from the opening portion.

According to this configuration, water can be reliably prevented from entering inside the case and the connector.

In the configuration described above, the waterproof wall may be provided with a waterproof upper wall covering above the connector or the mating connector that engages with the connector and a waterproof side wall that extends downward from the waterproof upper wall and covers a side of the connector or the mating connector.

This configuration in which at least the waterproof wall is provided with the waterproof upper wall and the waterproof side wall is protected from water from above and the side.

In the configuration described above, the waterproof portion may include, below the connector or the mating connector, a non-covered portion where the waterproof wall is not disposed.

According to this configuration, the non-covered portion gives freedom to fingers to engage the mating connector with the connector. This allows this engagement operation to be easily performed. This configuration is preferable in cases, such as when the electrical connection box is used disposed in the vehicle cabin of a vehicle, in which it is sufficient that the electrical connection box is protected from water from above and the side and does not need to be protected from water splashing from below.

In the configuration described above, the connector may be fixed to an upper surface of the circuit board; and the waterproof member may be provided with a tilt prevention wall that extends from the waterproof portion further downward than the circuit board and is disposed along the case side wall.

According to this configuration, the waterproof member and the connector can be prevented from tilting due to the weight of the waterproof portion and peeling of the fixing portion between the connector and the circuit board can be prevented.

In the configuration described above, the waterproof member may be provided with a clamping wall disposed with a gap between the clamping wall and the tilt prevention wall; and the case side wall may be disposed in the gap.

According to this configuration, the waterproof member together with the connector tilting and the connector peeling off from the circuit board can be reliably prevented by restricting the tilting of the waterproof member via the tilt prevention wall and the clamping wall.

In the configuration described above, the waterproof member may include, on an outer surface of the waterproof portion, a groove into which a peripheral edge portion of an opening edge of the opening portion of the case side wall fits.

According to this configuration, the structure in which the case side wall bites into the groove makes water even less likely to enter inside the case.

In the configuration described above, a portion of the groove located on the upper surface of the waterproof portion may be an upper groove portion defined by a pair of groove side surfaces that extend inward from the upper surface and a groove bottom surface that connects the groove side surfaces; and the groove bottom surface may have a mountain-like shape that inclines downward toward both ends from a central position between both ends of the upper surface.

According to this configuration, in the case in which water enters inside the upper groove portion, the water flows along the incline of the groove bottom surface and is discharged at both ends. Thus, water entering inside the case can be prevented.

In the configuration described above, a portion of the groove located on a side surface of the waterproof portion may be a side groove portion; and a lower end of the side groove portion may be disposed further downward than the circuit board.

According to this configuration, water that enters the groove is reliably discharged downward without flowing onto the circuit board.

In the configuration described above, the waterproof wall may include an insertion opening into which the mating connector is inserted; and the waterproof member may be provided with an erect wall that rises outward from an opening edge of the insertion opening.

According to this configuration, water adhered to the waterproof wall is prevented from entering inside the waterproof wall and entering inside from the engagement portion of the connector and the mating connector.

In the configuration described above, the connector-attached board may be provided with a frame that is attached to the circuit board; the waterproof member may be provided with a locking portion; and the frame may be provided with a locking receiving portion that engages with the locking portion.

According to this configuration, the waterproof member is engaged with the frame. Thus, compared to an example in which the waterproof member is engaged with the connector, the stress on the connector from attaching the waterproof member is reduced and the join portion between the connector and the circuit board is prevented from peeling.

In the configuration described above, the connector may be provided with a lock receiving portion capable of engaging with a lock portion provided on the mating connector; and the waterproof wall may be provided with a recess portion on an identical side to the lock receiving portion with respect to the connector, the recess portion exposing to outside at least a portion of the lock portion when the connector is in an engaged state with the mating connector.

According to this configuration, with the connector in an engaged state with the mating connector, at least a portion of the lock portion is exposed to the outside from the recess portion. Thus, to remove the mating connector from the connector, a simple operation is performed in which the worker puts a finger inside the recess portion and releases the engagement of the lock portion with the lock receiving portion.

Advantageous Effects of Invention

According to an electrical connection box disclosed by the present specification, waterproofing can be achieved simply and at a low cost.

DETAILED DESCRIPTION OF PREFERRED EMBODIMENTS

First Embodiment

The first embodiment will be described with reference to FIGS. 1 to 12. An electrical connection box 1 of the present embodiment is an electronic control unit (ECU) that supplies power from a power source of a vehicle to various electrical components and controls the power supply. The electrical connection box 1 is used installed in a vehicle cabin. The electrical connection box 1 is provided with a connector-attached board 10, an attachment 40 (corresponding to a waterproof member) that is attached to the connector-attached board 10, and a shield case 50 (corresponding to a case) that internally houses the connector-attached board 10.

Figure 3:
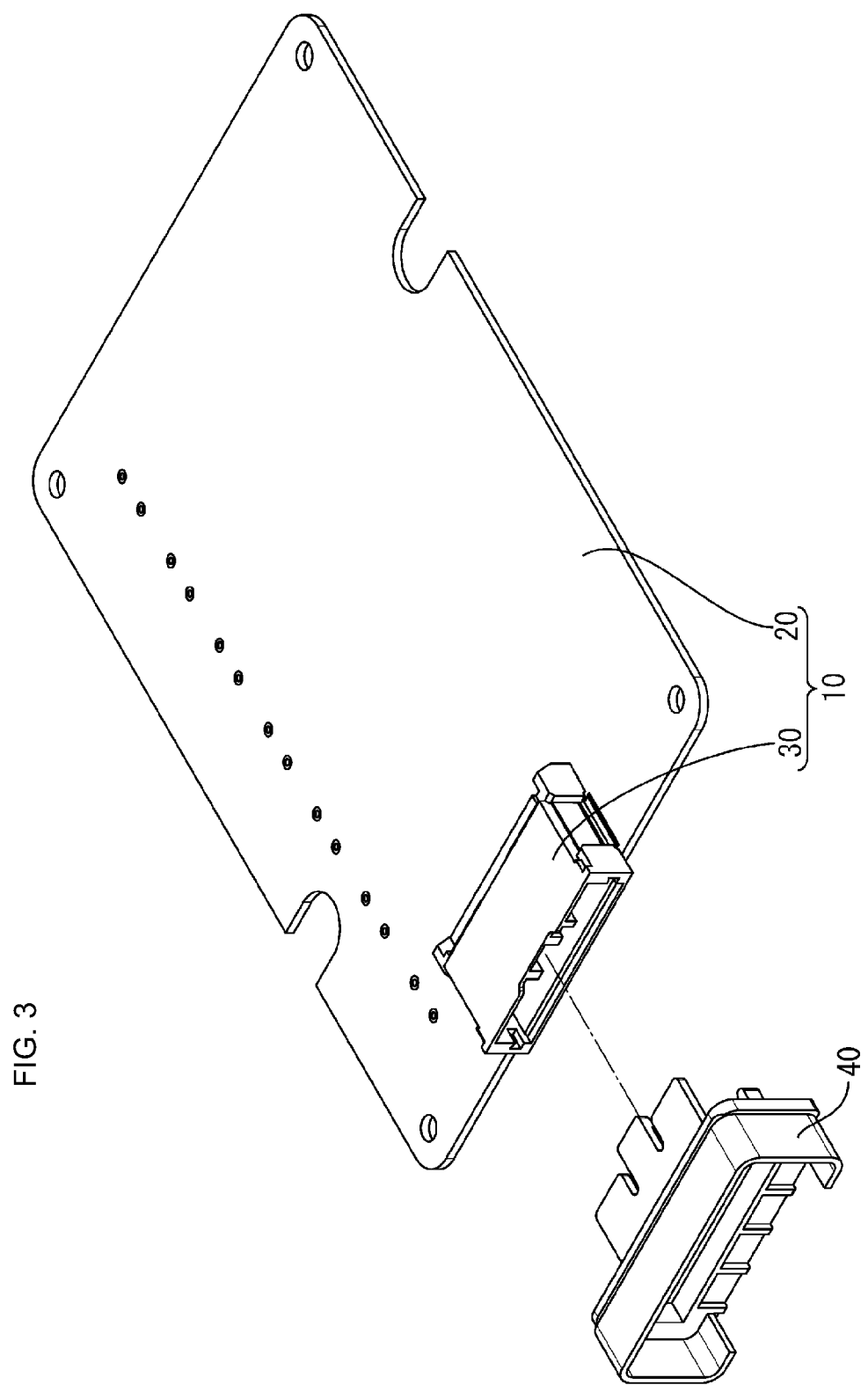
FIG. 3 is an exploded perspective view of a connector-attached board of the first embodiment.

As illustrated in FIG. 3, the connector-attached board 10 is provided with a circuit board 20 and a connector 30 fixed to the circuit board 20.

The circuit board 20 is a member with a known configuration in which a conductive path (not illustrated) is formed by printed wiring technology on an upper surface (mounting surface 21) of a rectangular insulating plate made from insulating material and an electronic component (not illustrated) is mounted.

The connector 30 is provided with a connector housing 31, two fixing fittings 35 for fixing the connector housing 31 to the circuit board 20, and a plurality of terminal fittings 36 attached to the connector housing 31 and connected to the conductive path on the circuit board 20.

Figure 5:
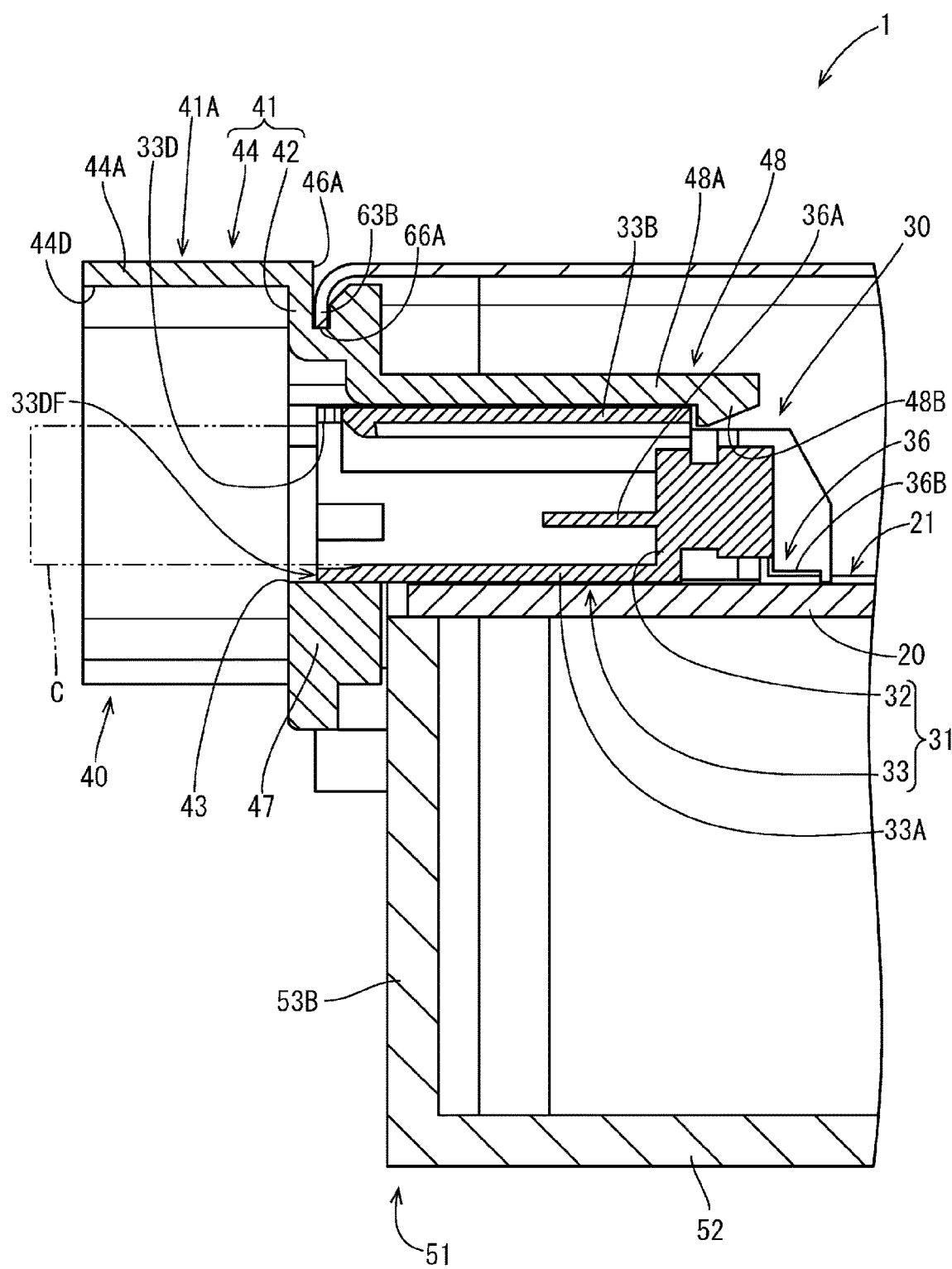
FIG. 5 is a cross-sectional view taken along line A-A of FIG. 1
Figure 7:
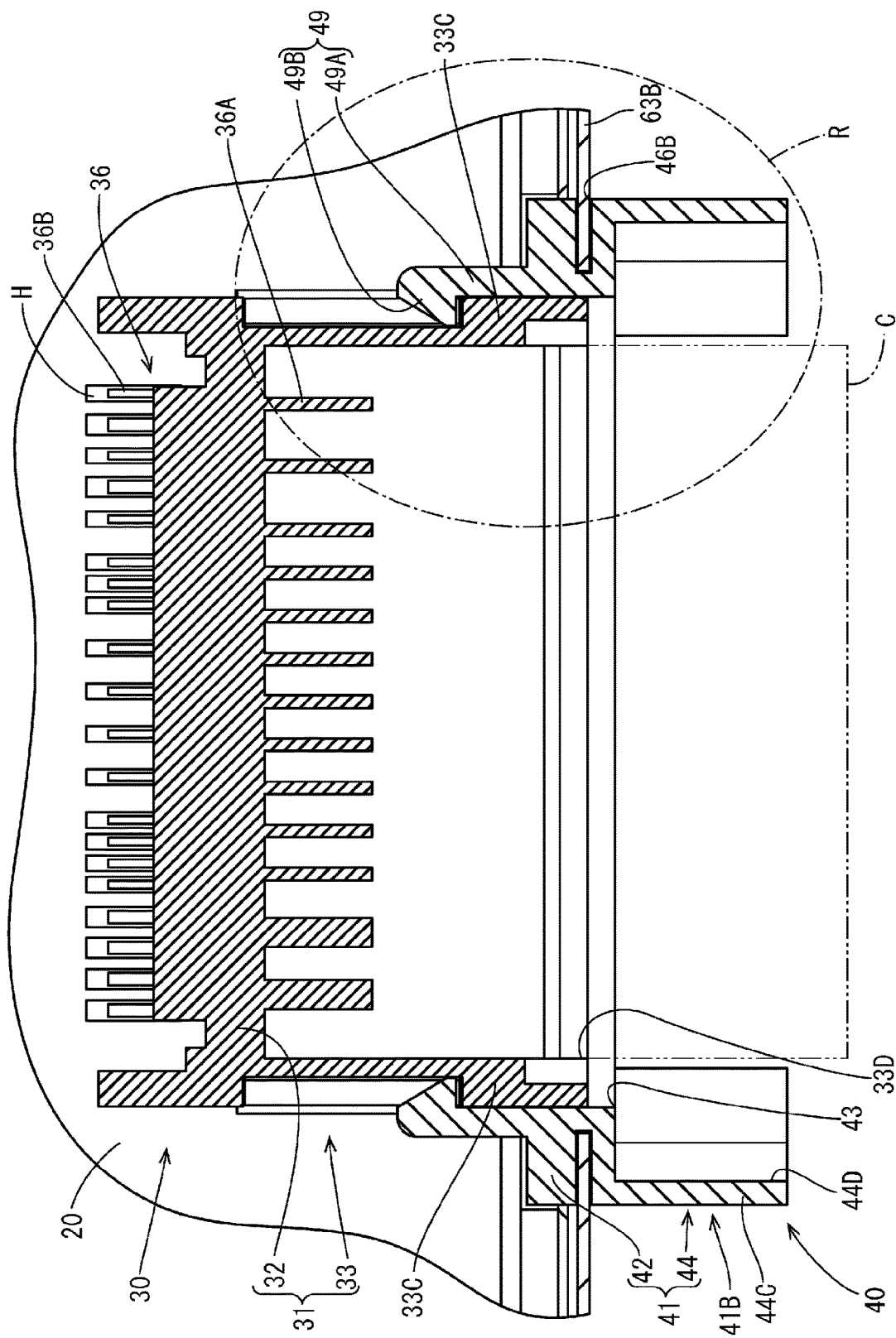
FIG. 7 is a cross-sectional view taken along line C-C of FIG. 1.

The connector housing 31 is made of a synthetic resin and, as illustrated in FIGS. 5 and 7, is provided with a terminal support wall 32 and a hood portion 33 contiguous with the terminal support wall 32.

Figure 4:
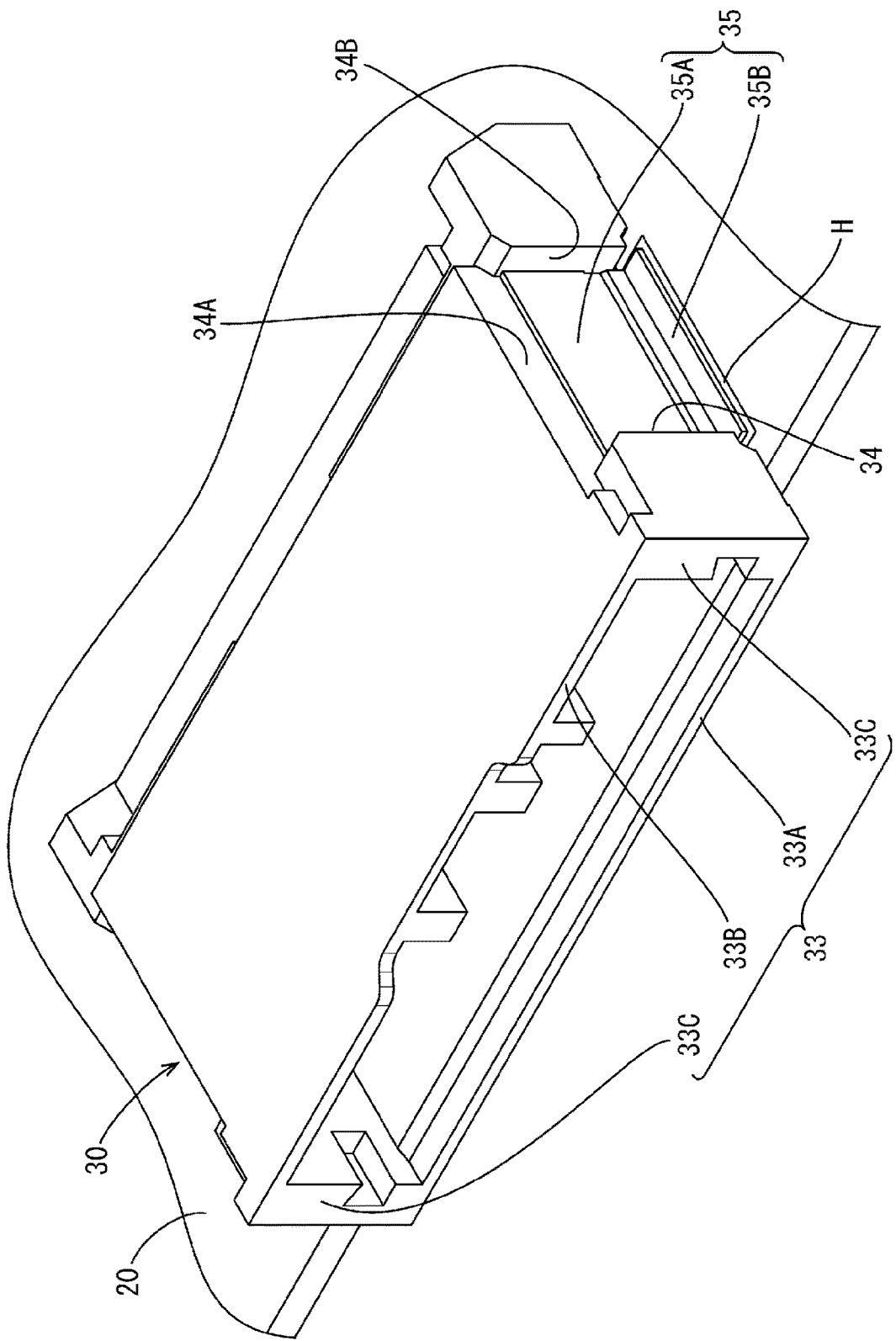
FIG. 4 is an enlarged perspective view of a portion of a connector and a circuit board of the first embodiment.

As illustrated in FIGS. 5 and 7, the terminal support wall 32 is a thick, plate-like portion that supports the terminal fittings 36. As illustrated in FIGS. 4, 5, and 7, the hood portion 33 is a rectangular prism-like portion that extends from the terminal support wall 32 and includes a hood bottom wall 33A disposed along the circuit board 20, a hood top wall 33B parallel with the hood bottom wall 33A, and two hood side walls 33C disposed perpendicular to the hood bottom wall 33A and the hood top wall 33B. An opening portion (engagement opening 33D) is also provided on the opposite side from the terminal support wall 32. As illustrated in FIGS. 5 and 7, the connector housing 31 is capable of receiving a mating connector C in the internal space defined by the terminal support wall 32 and the hood portion 33. An end surface of the hood portion 33 on the engagement opening 33D side corresponds to an engagement surface 33DF facing the mating connector C when the end surface and the mating connector C engage with one another.

Figure 8:
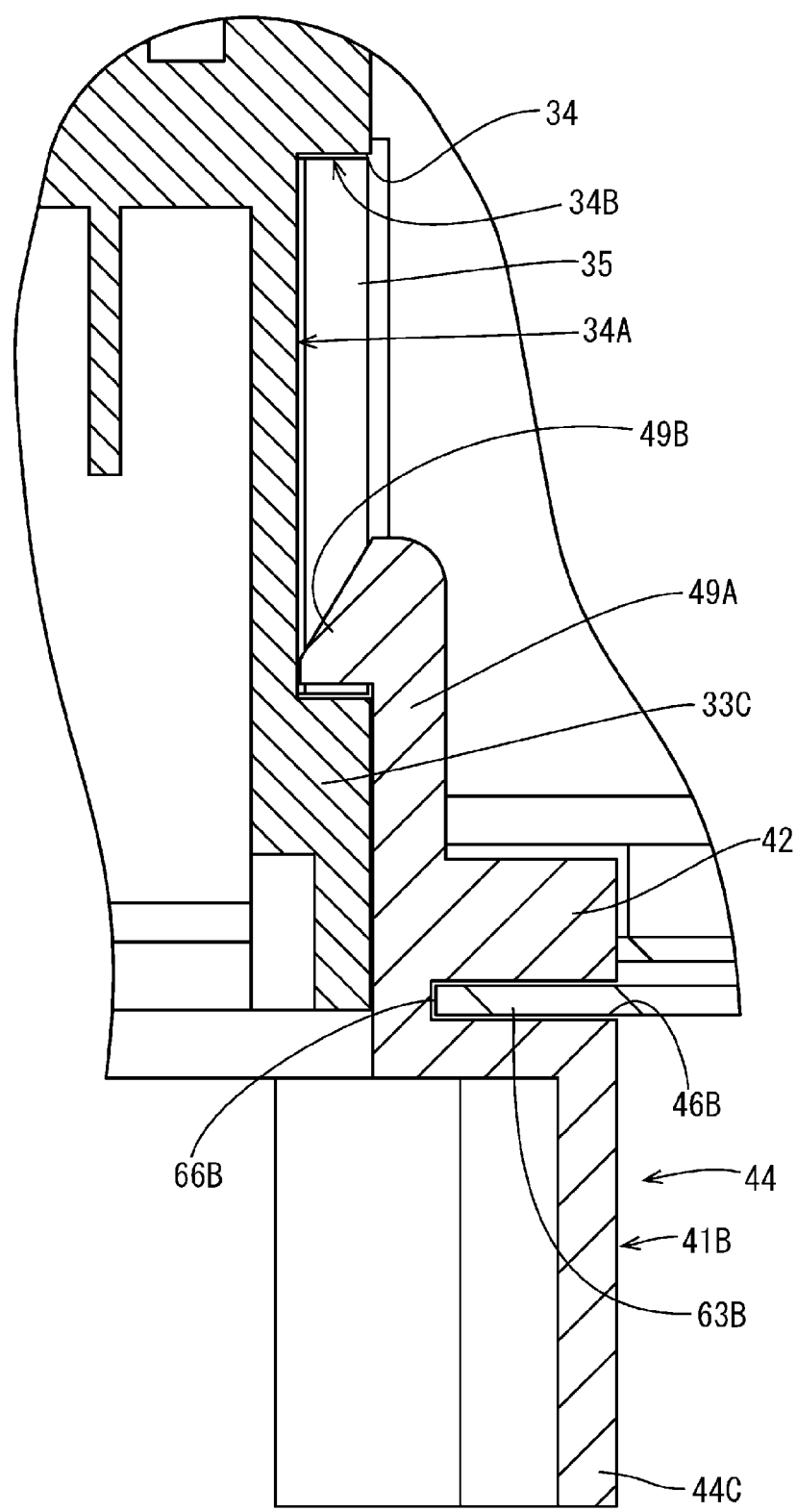
FIG. 8 is an enlarged view inside a region R of FIG. 7.

As illustrated in FIGS. 4 and 8, the two hood side walls 33C each include a mounting recess portion 34. The mounting recess portion 34 is a recess portion that extends inward from the outer surface of the hood side wall 33C and is defined by a pair of side surfaces 34B disposed opposite to one another and a rear surface 34A that connects the pair of side surfaces 34B.

The two fixing fittings 35 are members formed by performing a pressing process on a metal plate. As illustrated in FIG. 4, each fixing fitting 35 has a L-shape overall and is provided with a body portion 35A with a substantially rectangular shape and an attachment piece 35B with a plate-like shape that perpendicularly extends from one side of the body portion 35A. Though not illustrated in detail in the drawings, the two side edges (two sides perpendicular to the attachment piece 35B) of the body portion 35A are provided with a plurality of locking pieces, and the pair of side surfaces 34B are each provided with an engagement receiving portion that engages with the plurality of locking pieces.

One of the fixing fittings 35 is housed in the mounting recess portion 34 located in one of the hood side wall 33C, and the other fixing fitting 35 is housed in the mounting recess portion 34 located in the other hood side wall 33C. As illustrated in FIG. 4, the fixing fittings 35 are disposed with the body portion 35A disposed along the rear surface 34A and the attachment piece 35B disposed against the circuit board 20. By engaging the locking pieces with the engagement receiving portions, the fixing fittings 35 are supported in position.

The plurality of terminal fittings 36 are each bent elongated plate material made of metal. As illustrated in FIGS. 5 and 7, one end portion is a tab portion 36A that extends through the terminal support wall 32 and the other end portion is a board connection portion 36B electrically connected to the conductive path on the circuit board 20 via reflow soldering.

As illustrated in FIGS. 4 and 5, the connector 30 is fixed to the circuit board 20 by being placed on the mounting surface 21 with the hood bottom wall 33A orientated to be opposite to the circuit board 20 and then the attachment pieces 35B being reflow soldered to the circuit board 20. In the state of the connector 30 being fixed to the circuit board 20, a portion of the hood portion 33 adjacent to the engagement opening 33D projects out from one of the pair of short sides of the circuit board 20.

Figure 9:
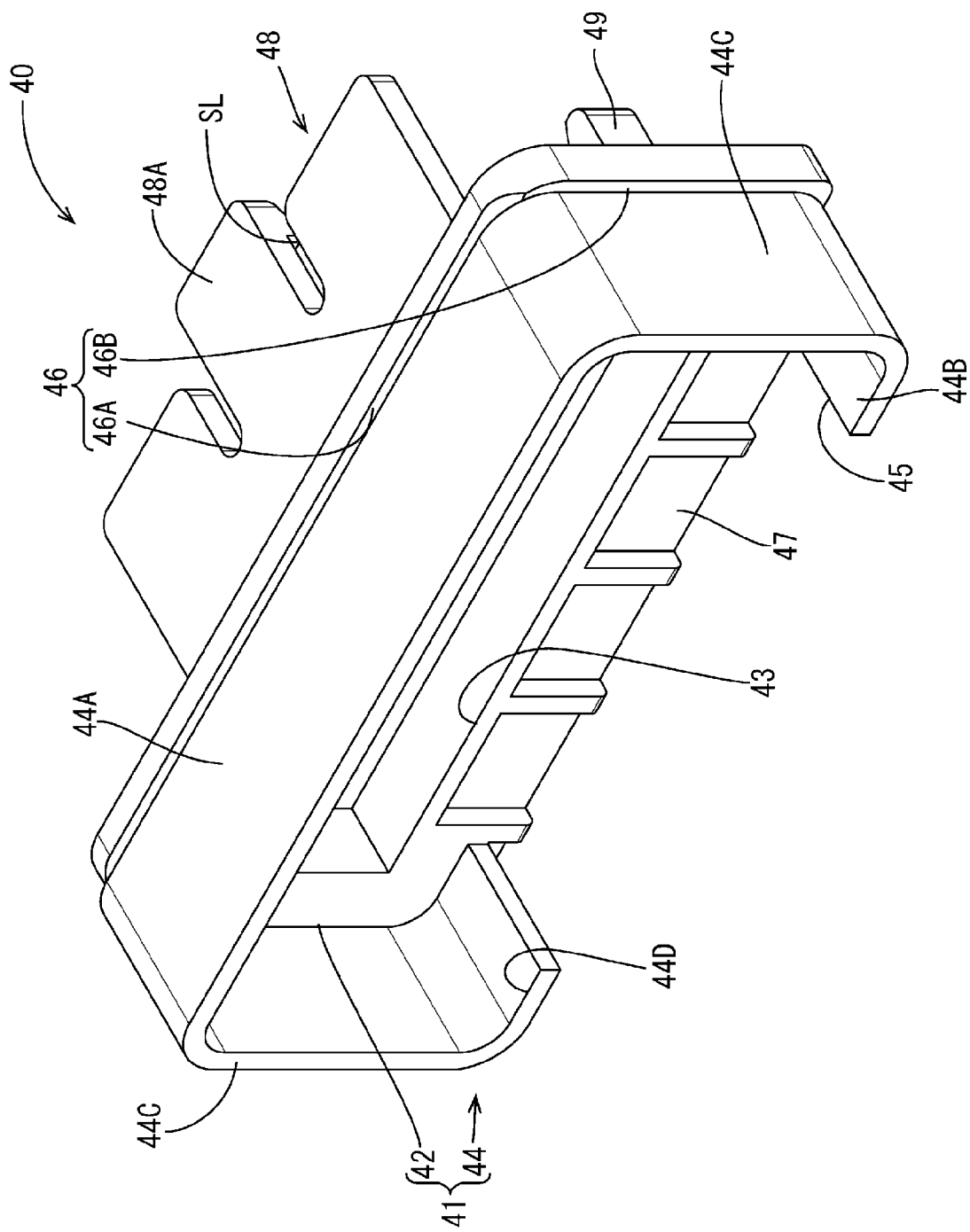
FIG. 9 is a perspective view of an attachment of the first embodiment.

The attachment 40 is a waterproof member that is attached to the connector 30. As illustrated in FIG. 9, the attachment 40 is provided with a waterproof portion 41 including a connector support wall 42 and a waterproof wall 44, a tilt prevention wall 47, a first locking portion 48, and two second locking portions 49.

The connector support wall 42 is a thick plate-like member. As illustrated in FIGS. 5, 7, 9, and 11, the connector support wall 42 includes a through-hole (connector support hole 43) that extends through the connector support wall 42 in the plate thickness direction and into which the hood portion 33 of the connector 30 can be inserted.

Figure 11:
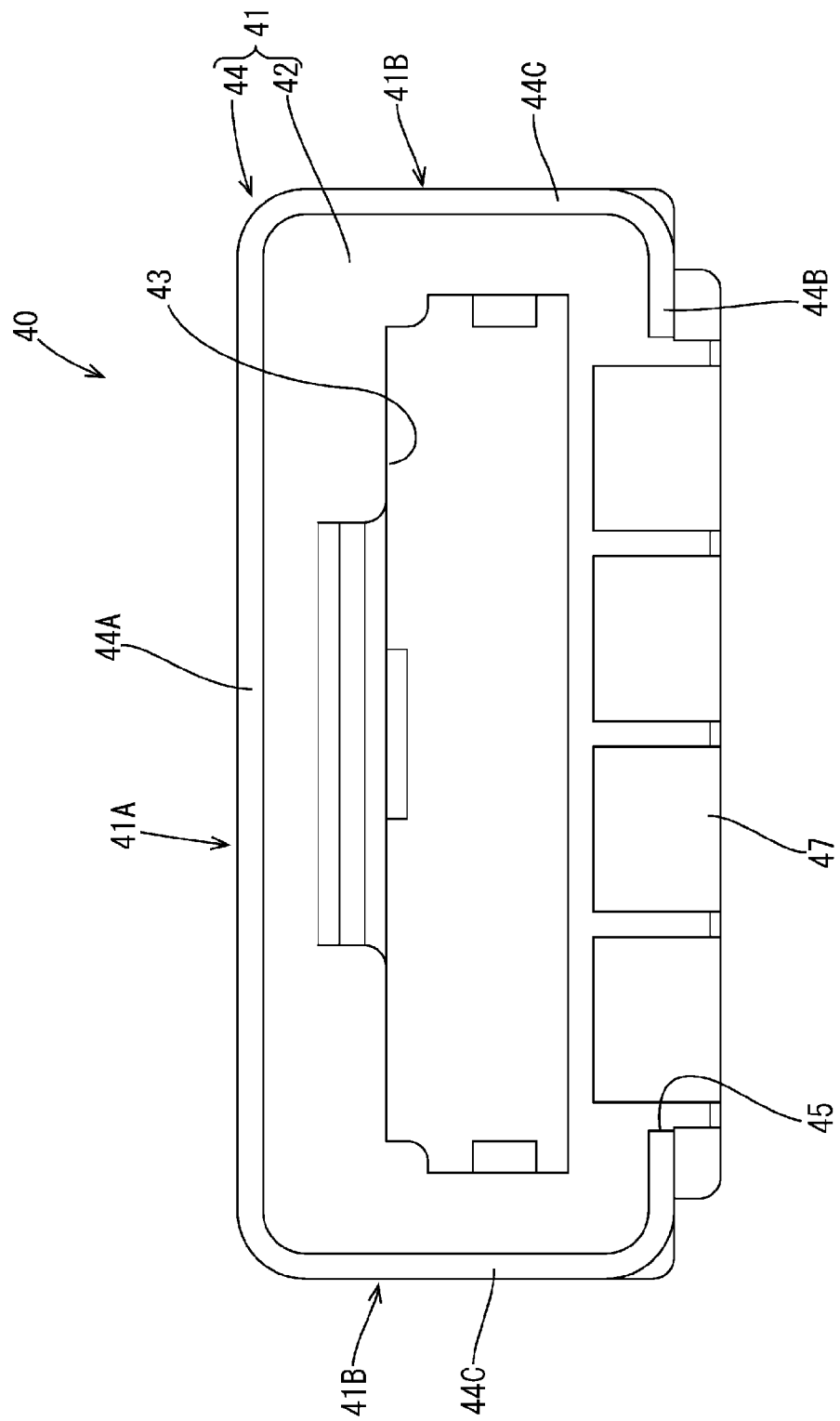
FIG. 11 is a front view of the attachment of the first embodiment.

As illustrated in FIGS. 9 and 11, the waterproof wall 44 is a rectangular prism-like portion extending form the peripheral edge of the connector support wall 42 and includes a waterproof upper wall 44A, a waterproof lower wall 44B parallel with the waterproof upper wall 44A, and two waterproof side walls 44C disposed perpendicular to the waterproof upper wall 44A and the waterproof lower wall 44B. An opening portion (insertion opening 44D) into which the mating connector C can be inserted is provided on one end of the waterproof wall 44. The waterproof lower wall 44B includes an escape recess portion 45 (corresponding to a non-covered portion) recessed from the opening edge of the insertion opening 44D toward the connector support wall 42. The escape recess portion 45 is a recess portion that gives freedom to the fingers of a worker to engage the mating connector C with the connector 30.

Figure 6:
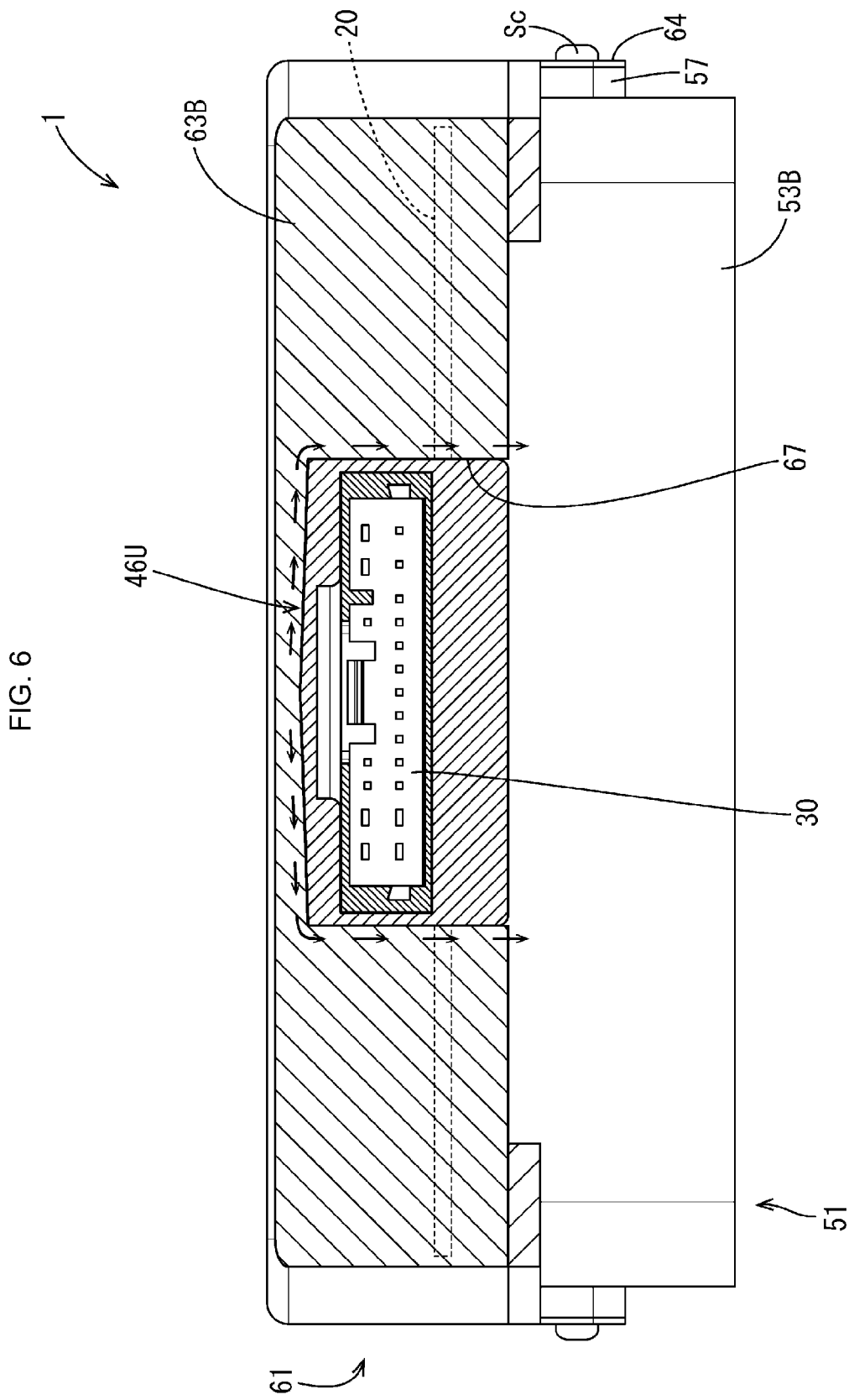
FIG. 6 is a cross-sectional view taken along line B-B of FIG. 1.
Figure 10:
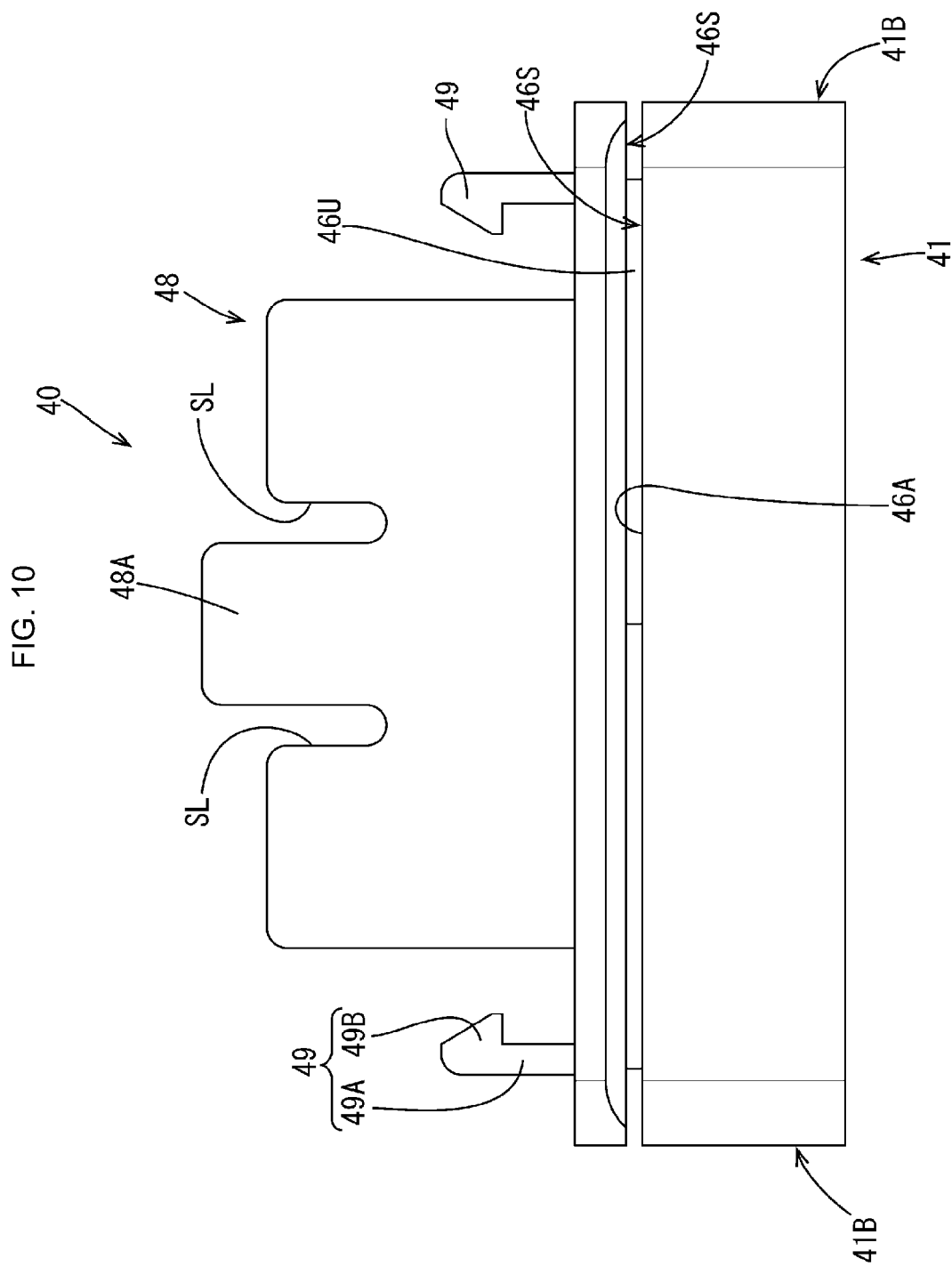
FIG. 10 is a top view of the attachment of the first embodiment.
Figure 12:
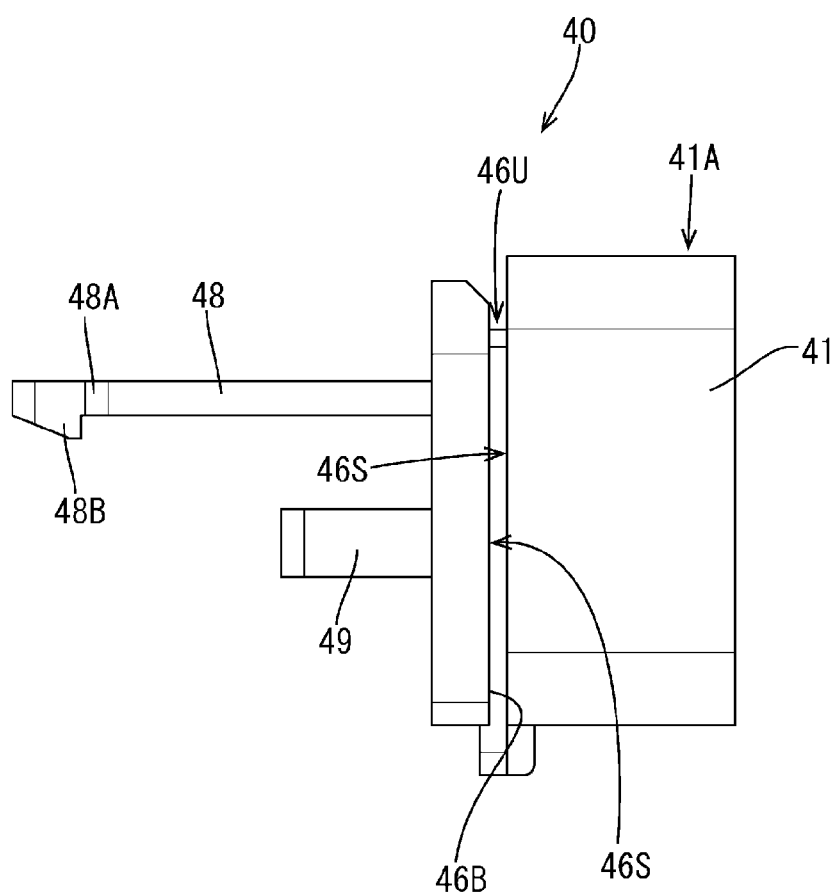
FIG. 12 is a side view of the attachment of the first embodiment.

As illustrated in FIGS. 5, 7, and 9, the waterproof portion 41 includes an engagement groove 46 that extends in the circumferential direction in an upper surface (a waterproof upper surface 41A) and in a pair of side surfaces (waterproof side surfaces 41B) of the outer peripheral surface of the waterproof wall 44. As illustrated in FIGS. 10 and 12, the engagement groove 46 is a groove defined by a pair of groove side surfaces 46S that extend inward from the outer peripheral surface of the waterproof portion 41 and a groove bottom surface 46U that connects the groove side surfaces 46S. The portion of the engagement groove 46 located in the waterproof upper surface 41A is an upper groove portion 46A, and the portions of the engagement groove 46 located in the two waterproof side surfaces 41B are side groove portions 46B. As illustrated in FIG. 6, the groove bottom surface 46U of the upper groove portion 46A has a highest position in a central position between the ends (the two waterproof side surfaces 41B) inclines downward from the central position toward the two waterproof side surfaces 41B. As illustrated in FIG. 12, the lower ends of the side groove portions 46B are located down near the lower ends (the corner portions with the lower surface) of the waterproof side surfaces 41B.

As illustrated in FIGS. 9 and 11, the tilt prevention wall 47 is a wall that extends downward from the connector support wall 42 and is disposed across the entire lower surface of the connector support wall 42 except for at a portion near either end.

As illustrated in FIGS. 9 and 11, the first locking portion 48 is a wide, plate-like portion that projects from the connector support wall 42 in an opposite direction to the waterproof wall 44 and is disposed parallel with the waterproof upper wall 44A. As illustrated in FIGS. 9 and 10, the leading end portion of the first locking portion 48 is divided into three by two slits SL1. The central divided portion corresponds to a first bending piece 48A that is capable of bending in the vertical direction. As illustrated in FIG. 12, a first locking catch 48B for locking together with the terminal support wall 32 that projects downward is disposed on the end of the first bending piece 48A.

As illustrated in FIG. 10, the two second locking portions 49 each include a rod-like second bending piece 49A that projects from the connector support wall 42 to the side opposite the waterproof wall 44 and a second locking catch 49B for locking together with the side surface 34B of the mounting recess portion 34 that projects from the end of the second bending piece 49A.

Figure 1:
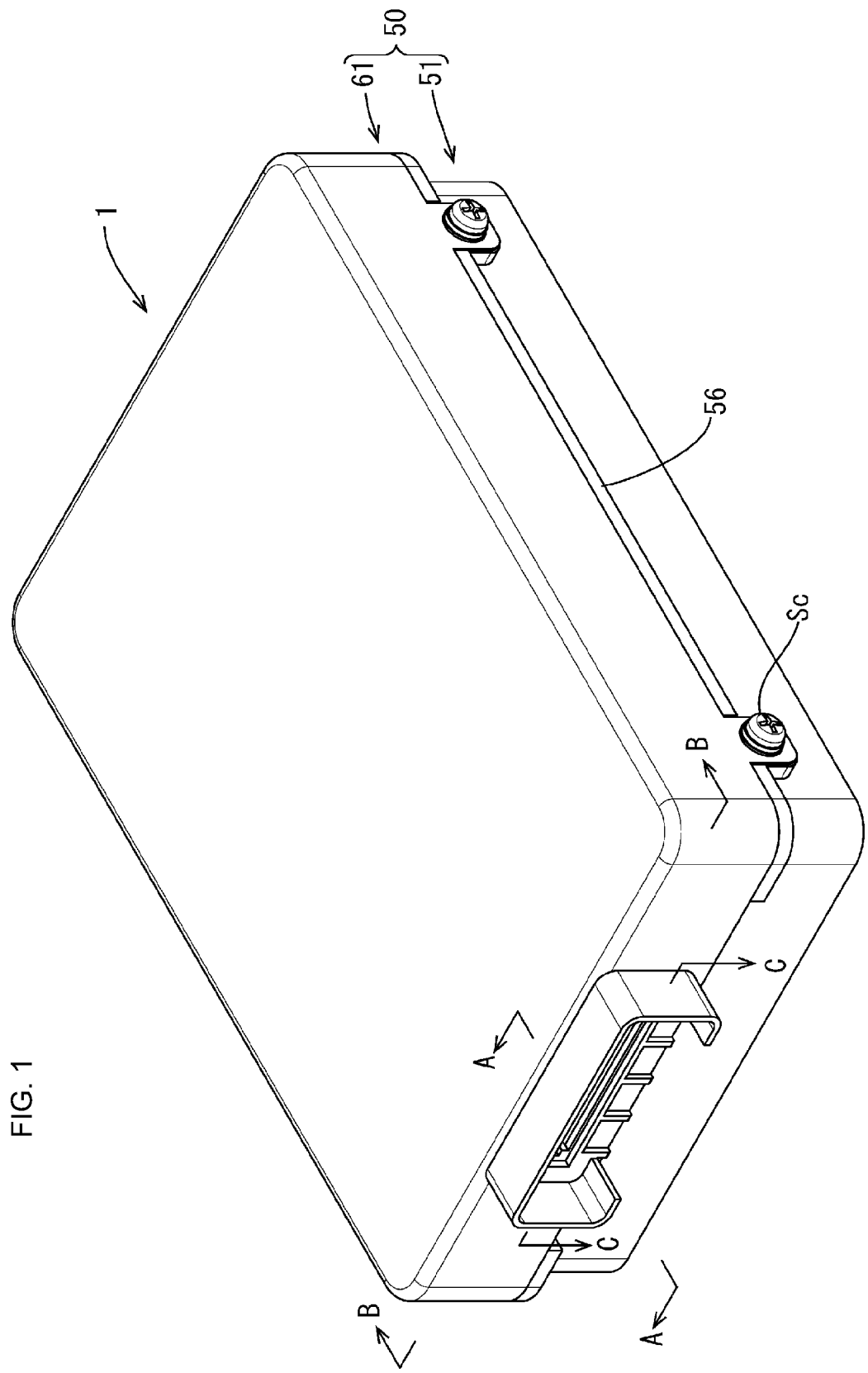
FIG. 1 is a perspective view of an electrical connection box of a first embodiment.

As illustrated in FIG. 1, the shield case 50 is made of metal and includes a lower case 51 that internally houses the circuit board 20 and an upper case 61 that is attached to the lower case 51.

Figure 2:
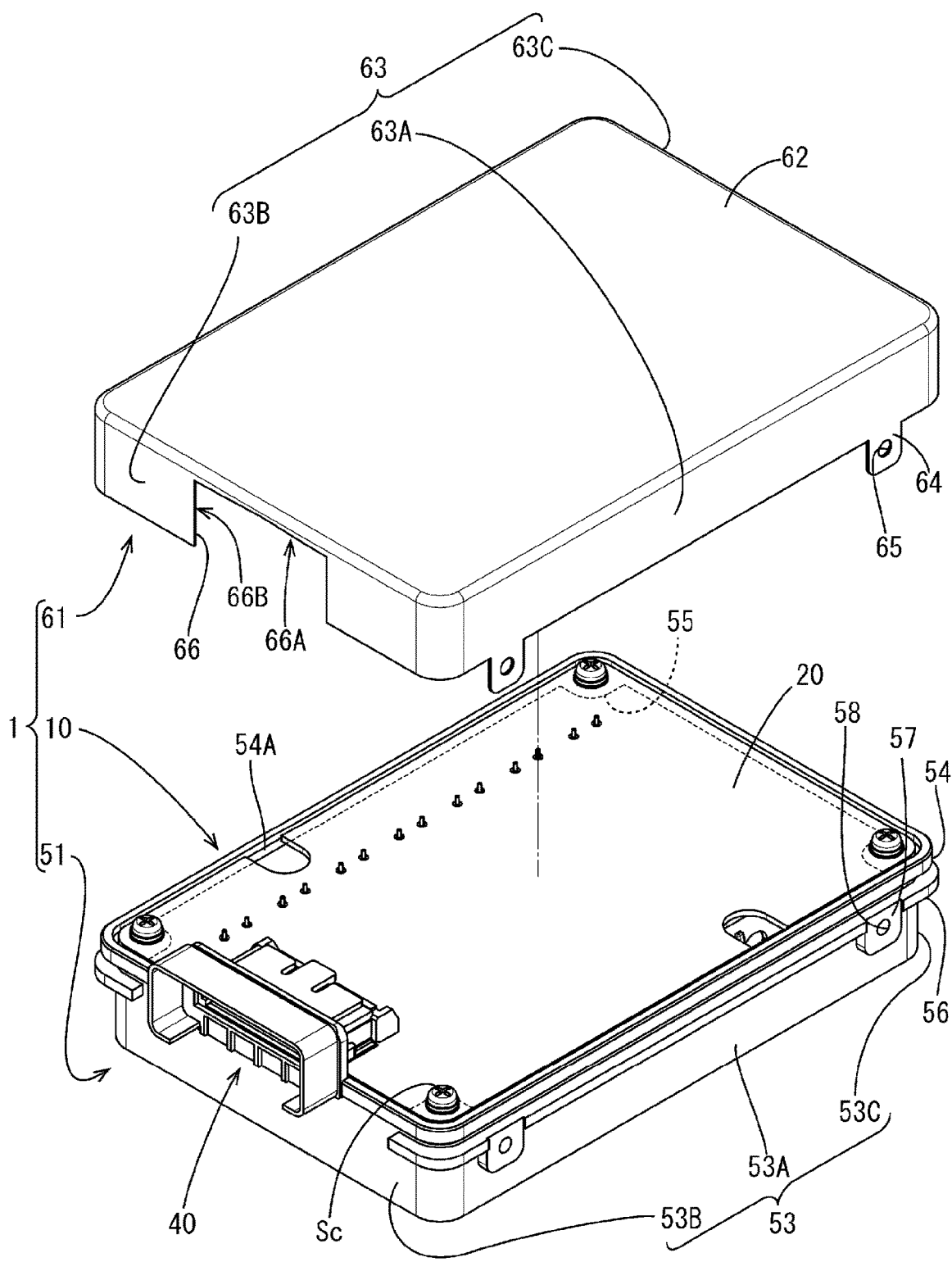
FIG. 2 is an exploded perspective view of the electrical connection box of the first embodiment.

The lower case 51 is manufactured by die casting and is a tray-like member with an open upper side. As illustrated in FIGS. 2 and 5, the lower case 51 is provided with a rectangular, plate-like case bottom wall 52, a lower peripheral wall portion 53 that is erected vertically from the peripheral edge of the case bottom wall 52, a board support portion 54 disposed on an upper edge of the lower peripheral wall portion 53, a pair of flange portions 56 projecting from the lower peripheral wall portion 53, and a plurality of base portions 57.

As illustrated in FIG. 2, the lower peripheral wall portion 53 includes a pair of lower long wall portions 53A that are erected from the pair of long sides of the case bottom wall 52 and a pair of lower short wall portions 53B, 53C that are erected upward from the pair of short sides of the case bottom wall 52.

As illustrated in FIG. 2, the board support portion 54 has a shape that extends outward from an upper edge of the lower peripheral wall portion 53 with the extending end extending upward and is provided with, on the inner side, a step portion including a step surface 54A facing upward that supports the circuit board 20. The board support portion 54 is provided around roughly the entire periphery except for at a central position (a position where a connector opening 67, described below, is disposed) of one of the lower short wall portions 53B (corresponding to the case side wall). Also, as illustrated in FIG. 2, in the four corners of the inner portion of the lower case 51, screw holes and screw receiving portions 55 for fixing the circuit board 20 are disposed.

As illustrated in FIG. 2, the pair of flange portions 56 are each flange-like portions that project outward from the lower peripheral wall portion 53 and support the upper case 61. The flange portions 56 are disposed below the board support portion 54 at the lower long wall portions 53A and corner portions at both ends of the lower long wall portions 53A with a space between the flange portions 56 and the board support portion 54. As illustrated in FIG. 2, the base portions 57 are portions into which screws Sc for screwing in the upper case 61 are screwed into. Two of the base portions 57 are disposed at each lower long wall portion 53A below the flange portions 56. The base portions 57 are each rectangular base-like portions that project outward form the lower long wall portions 53A and include a screw hole 58.

The upper case 61 is formed by a drawing process, for example, and is a member for closing the opening portion of the lower case 51. As illustrated in FIG. 2, the upper case 61 is provided with a rectangular, plate-like case top wall 62 slightly larger than the case bottom wall 52, an upper peripheral wall portion 63 that extends vertically downward from the peripheral edge of the case top wall 62, and a plurality of fixing pieces 64 that extend from the upper peripheral wall portion 63.

The upper peripheral wall portion 63 includes a pair of upper long wall portions 63A extending from the pair of long sides of the case top wall 62 and a pair of upper short wall portions 63B, 63C extending from the pair of short sides of the case top wall 62. The upper peripheral wall portion 63 is slightly larger than the board support portion 54 and is capable of internally housing the portion of the lower peripheral wall portion 53 above the flange portions 56 and the board support portion 54.

As illustrated in FIG. 2, the upper short wall portion 63B (corresponding to the case side wall) of the pair of upper short wall portions 63B, 63C includes a cutout portion 66. The cutout portion 66 has a shape formed by the upper short wall portion 63B being cut from the lower edge upward and is a recess portion defined by a pair of side edges 66B extending upward (toward the case top wall 62) from the lower edge of the upper short wall portion 63B and a rear edge 66A connecting the pair of side edges 66B. As illustrated in FIG. 6, with the lower case 51 and the upper case 61 assembled together, an opening portion defined by a cutout edge (rear edge 66A and the pair of side edges 66B) of the cutout portion 66 and a portion of the upper edge of the lower case 51 where the board support portion 54 is not disposed forms the connector opening 67.

As illustrated in FIG. 2, the plurality of fixing pieces 64 are plate-like portions extending from the lower end of the pair of upper long wall portions 63A, each one including a screw insertion hole 65. The fixing pieces 64 are disposed at a position corresponding to the base portions 57 of the lower case 51.

An example of a process of manufacturing the electrical connection box 1 will be described below.

First, the connector 30 is fixed to the circuit board 20 by reflow soldering. Solder H is applied in advance to the portions where soldering is to be performed on the mounting surface 21 of the circuit board 20. Next, the connector 30 is placed on the mounting surface 21 of the circuit board 20. Here, the board connection portion 36B of the terminal fittings 36 are placed on the solder H and the attachment piece 35B of the fixing fittings 35 are also placed on the solder H. Then, circuit board 20 with the connector 30 placed thereon is ran through a reflow oven (not illustrated), and the solder H melts. Thereafter, when the solder H cools and hardens, the board connection portion 36B of the terminal fittings 36 are fixed to conductive paths and electrical conduction is enable and the attachment piece 35B of the fixing fittings 35 are fixed to the circuit board 20. In this way, the connector 30 is fixed to the circuit board 20 (see FIG. 3). With the connector 30 fixed to the circuit board 20, a portion of the hood portion 33 adjacent to the engagement opening 33D (right end portion in FIG. 5) is projecting from the edge of the circuit board 20 approximately an amount equal to the sum of the thickness of the lower short wall portion 53B and the thickness of the upper short wall portion 63B. In this way, the connector 30 is fixed to the circuit board 20 and the connector-attached board 10 is obtained.

Next, the attachment 40 is attached to the connector 30. The leading end portion of the hood portion 33 is inserted into the connector support hole 43 with the first locking portion 48 sliding along the hood top wall 33B and the two second locking portions 49 sliding along the two hood side walls 33C. The first bending piece 48A bends outward as the first locking catch 48B runs up onto the hood top wall 33B, and the first bending piece 48A elastically returns when the first locking catch 48B goes past the hood top wall 33B, locking the first locking portion 48 to the terminal support wall 32 (see FIG. 5). In a similar manner, the second bending pieces 49A bend outward as the two second locking catches 49B run up onto the two hood side walls 33C, and the second bending pieces 49A elastically return when the second locking catches 49B enter the mounting recess portions 34, locking the second locking portions 49 to the hood side walls 33C (see FIGS. 7 and 8). In this way, the attachment 40 is attached to the connector 30.

As illustrated in FIG. 5, with the attachment 40 attached to the connector 30, the engagement surface 33DF where the engagement opening 33D, an entrance through which water may enter inside, of the connector 30 opens is located inside the connector support hole 43 of the waterproof portion 41. In other words, the periphery of the engagement surface 33DF of the connector 30 is covered by the waterproof portion 41. Accordingly, water can be prevented from entering inside the connector 30 from the engagement opening 33D.

Next, the connector-attached board 10 is attached to the lower case 51. The circuit board 20 is placed on the step surface 54A and fixed at the screw receiving portions 55 via the screws Sc. The circuit board 20 is housed with the upper surface (mounting surface 21) roughly matching the upper end of the board support portion 54 (see FIG. 2). The circuit board 20 is slightly smaller than the board support portion 54, and a gap is formed between the circuit board 20 and the inner peripheral surface of the board support portion 54. Also, the waterproof wall 44 is disposed in a portion of the lower short wall portion 53B where the board support portion 54 is not disposed, and the tilt prevention wall 47 is disposed in contact with the outer surface of the lower short wall portion 53B (see FIG. 5). Accordingly, the attachment 40 is prevented from tilting downward at the waterproof wall 44 side, and the connector 30 is prevented from peeling away from the circuit board 20 due to the weight of the attachment 40.

Next, the upper case 61 is attached to the lower case 51. The upper case 61 is placed over and attached to the lower case 51 from above with the upper peripheral wall portion 63 placed on the flange portions 56 (see FIG. 1). The upper end portion (portion above the flange portions 56) of the lower peripheral wall portion 53 and the board support portion 54 are housed inside the upper peripheral wall portion 63. Also, the peripheral portion of the cutout edge of the cutout portion 66 (the rear edge 66A and the pair of side edges 66B) of the upper case 61 fits into the engagement groove 46 (see FIGS. 5 and 7). In this state, the plurality of fixing pieces 64 are fixed to the plurality of base portions 57 via the screws Sc. The fixing pieces 64 and the base portions 57 are located lower than the circuit board 20 (see FIG. 6). Thus, in the case in which water enters inside the shield case 50 from the screw hole 58, the water does not come into contact with the circuit board 20.

With the lower case 51 and the upper case 61 fixed to one another, the opening portion defined by the rear edge 66A, the pair of side edges 66B, and the upper edge of the lower peripheral wall portion 53 form the connector opening 67. The waterproof portion 41 projects outward from the connector opening 67 and the hood portion 33 faces out through the connector opening 67. The connector 30 is disposed with the opening edge of the engagement opening 33D located at a position aligned with the upper short wall portion 63B or a position slightly inward therefrom (see FIGS. 5 and 7). The attachment 40 is disposed with a portion of the terminal support wall 32 and the waterproof wall 44 projecting outward (specifically, further outward than the upper short wall portion 63B) of the shield case 50 from the connector opening 67 (see FIGS. 5, 6, and 7).

A gap is formed between the flange portions 56 and the board support portion 54. Thus, in the case in which water enters inside from between the flange portions 56 and the upper peripheral wall portion 63, the water that enters flows to the gap between the flange portions 56 and the board support portion 54 and spills down from both ends of the flange portions 56. In this way, the water that enters is prevented from going over the board support portion 54 and entering inside the shield case 50 (see FIG. 2).

The mating connector C that engages with the connector 30 is entered inside the waterproof wall 44 and is engaged inside the hood portion 33. The waterproof wall 44 covers the mating connector C from above and both sides. Thus, water from above or the sides is prevented from entering inside from the engagement portion between the connector 30 and the mating connector C (see FIGS. 5 and 7).

According to the present embodiment described above, the electrical connection box 1 is provided with the connector-attached board 10, the attachment 40 that is attached to the connector-attached board 10, and the shield case 50 that internally houses the connector-attached board 10. The connector-attached board 10 is provided with the circuit board 20 and the connector 30 that is fixed to the circuit board 20 and that engages with the mating connector C. The shield case 50 surrounds the circuit board 20 and is provided with the upper short wall portion 63B and the lower short wall portion 53B that include the connector opening 67 for facing the connector 30 outside. The attachment 40 is provided with the waterproof portion 41 that covers the periphery of the engagement surface 33DF of the connector 30 that faces the mating connector C, and the waterproof portion 41 is provided with the waterproof wall 44 that covers the periphery of the connector 30 and the mating connector C.

According to the configuration described above, the attachment 40, formed as a separate member, is attached to the connector-attached board 10. Thus, there is no need to develop a dedicated connector with a waterproof structure, and waterproofing can be achieved simply and at a low cost.

Also, the waterproof wall 44 projects outside the shield case 50 from the connector opening 67. According to this configuration, water can be reliably prevented from entering inside the shield case 50 and the connector 30.

Also, the waterproof wall 44 is provided with the waterproof upper wall 44A that covers the top of the mating connector C that engages with the connector 30 and the waterproof side walls 44C that extend downward from the waterproof upper wall 44A and cover the sides of the mating connector C.

This configuration is protected from water from above and the sides. In the present embodiment, the electrical connection box 1 is an electronic control unit (ECU) disposed in a vehicle cabin of a vehicle. Thus, the electrical connection box 1 does not need to protect against water splashing up from below. Instead, it is sufficient that the electrical connection box 1 can be protected against water from above and the sides, such as spilled drinks, rain water dripping from an umbrella brought inside the vehicle, droplets of condensation formed in the vehicle cabin, and the like. For this reason, the attachment 40 being provided with the waterproof upper wall 44A and the waterproof side walls 44C is sufficient.

Also, the waterproof portion 41 includes the escape recess portion 45 below the mating connector C where the waterproof wall 44 is not disposed. According to this configuration, the escape recess portion 45 gives freedom to fingers to engage the mating connector C with the connector 30. This allows this engagement operation to be easily performed. As described above, it is sufficient that the electrical connection box 1 of the present embodiment is protected from water from above and the sides. Thus, the escape recess portion 45 can be provided in this manner to facilitate the engagement operation.

Also, the connector 30 is fixed to the mounting surface 21 of the circuit board 20, and the attachment 40 is provided with the tilt prevention wall 47 that extends from the waterproof portion 41 further downward than the circuit board 20 and is disposed along the lower short wall portion 53B. According to this configuration, the attachment 40 and the connector 30 can be prevented from tilting due to the weight of the waterproof portion 41 and peeling of the fixing portion between the connector 30 and the circuit board 20 can be prevented. In such a configuration, the connector 30 is preferably fixed to the circuit board 20 via soldering.

Also, the outer surface of the waterproof portion 41 is provided with the engagement groove 46 into which the opening edge of the connector opening 67 of the shield case 50, in other words, the periphery edge portion of the cutout edge (the rear edge 66A and the pair of side edges 66B) of the cutout portion 66, fits. According to this configuration, the structure in which the upper case 61 bites into the engagement groove 46 makes water even less likely to enter inside the shield case 50.

The portion of the engagement groove 46 located on the upper surface (waterproof upper surface 41A) of the waterproof portion 41 is the upper groove portion 46A defined by the pair of groove side surfaces 46S that extend inward from the waterproof upper surface 41A and the groove bottom surface 46U that connects the groove side surfaces 46S. The groove bottom surface 46U has a mountain-like shape that inclines downward toward both ends from a central position between both ends of the waterproof upper surface 41A. According to this configuration, in the case in which water enters inside the upper groove portion 46A, as illustrated by the arrow in FIG. 6, the water flows along the incline of the groove bottom surface 46U and is discharged at both ends. Thus, water entering inside the shield case 50 can be prevented.

Portions of the engagement groove 46 located on the side surfaces (waterproof side surfaces 41B) of the waterproof portion 41 are the side groove portions 46B. The lower ends of the side groove portions 46B are disposed lower than the circuit board 20. According to this configuration, as illustrated by the arrow in FIG. 6, water that enters the engagement groove 46 is reliably discharged downward without flowing onto the circuit board 20.

Modified Example 1

Figure 13:
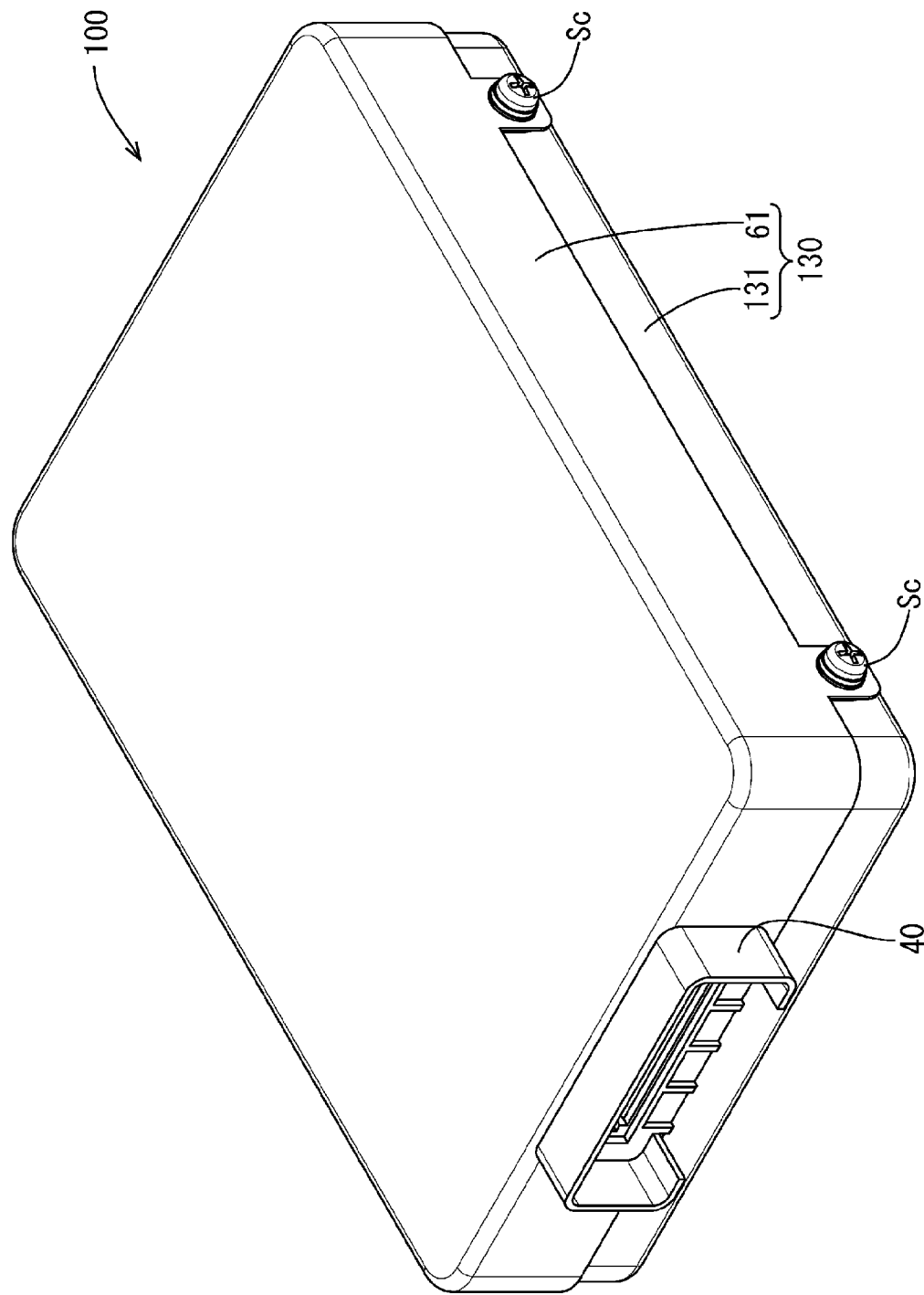
FIG. 13 is a perspective view of an electrical connection box of modified example 1.

Modified example 1 will be described with reference to FIGS. 13 and 14. An electrical connection box 100 of the present modified example is different from that of the first embodiment in that the shape of a lower case 131 of a shield case 130 is different and a connector-attached board 110 is provided with a spacer 120 attached to the circuit board 20. In the present modified example, components similar to that of the first embodiment are given the same reference sign and description thereof will be omitted.

The lower case 131 is formed by a drawing process, for example, and is a tray-like member with an open upper side. As illustrated in FIG. 14, the lower case 131 is provided with a rectangular, plate-like case bottom wall 132 and a lower peripheral wall portion 133 that is erected vertically from the peripheral edge of the case bottom wall 132.

The lower peripheral wall portion 133 includes a pair of lower long wall portions 133A that are erected from the case bottom wall 132 and a pair of lower short wall portions 133B that are erected from the pair of short sides of the case bottom wall 132. The pair of lower long wall portions 133A include screw insertion holes 134 at positions corresponding to the plurality of fixing pieces 64 of the upper case 61.

Figure 14:
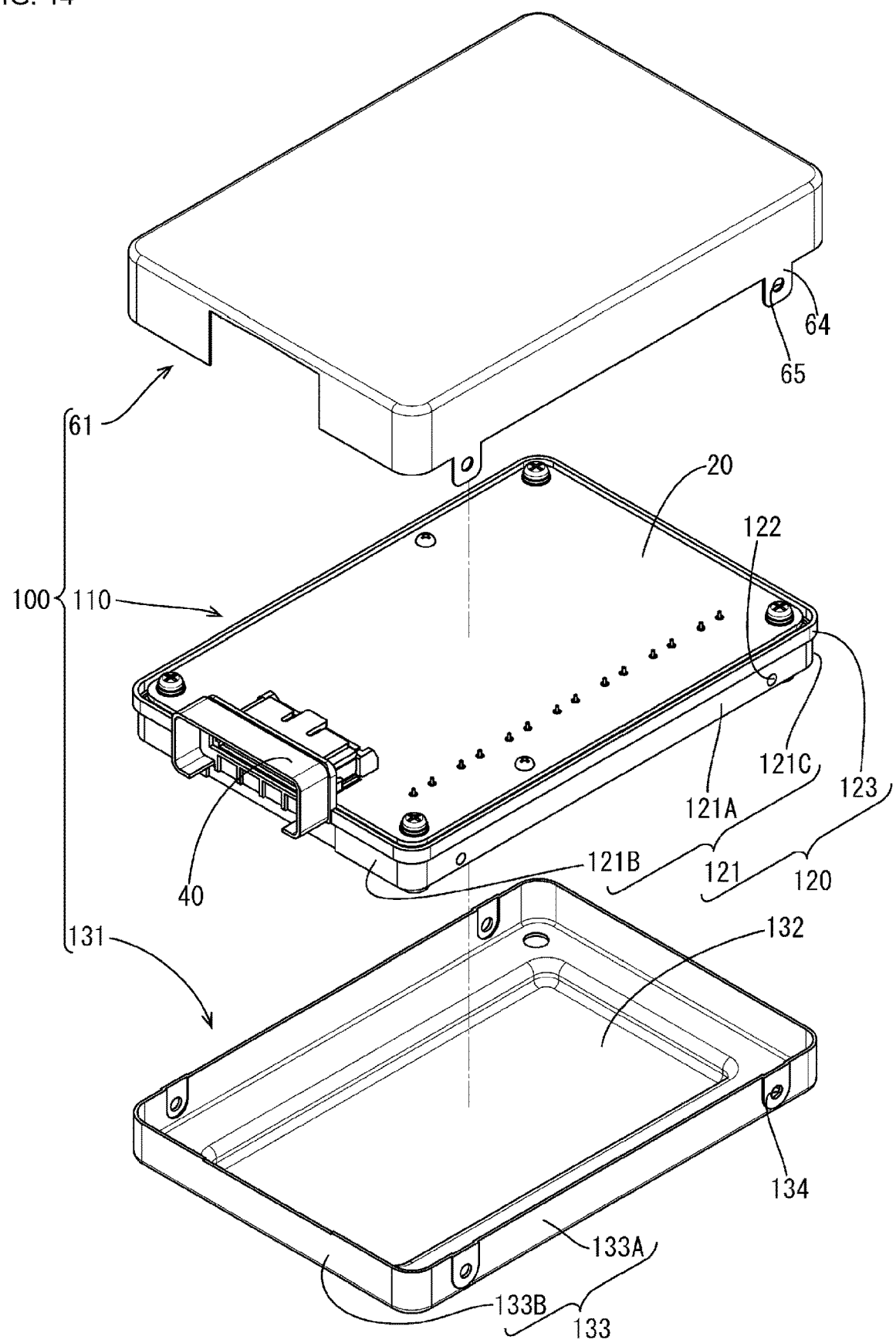
FIG. 14 is an exploded perspective view of the electrical connection box of modified example 1.

The spacer 120 is a member housed in the lower case 131 that supports the circuit board 20 and, as illustrated in FIG. 14, is provided with a frame portion 121 and a board support portion 123.

The frame portion 121 is a rectangular, frame-like member slightly smaller than the lower peripheral wall portion 133. The frame portion 121 is provided with a pair of long frame portions 121A opposite the pair of lower long wall portions 133A and a pair of short frame portions 121B, 121C opposite the pair of lower short wall portions 133B. The long frame portions 121A include screw holes 122 at positions corresponding to the plurality of screw insertion holes 134 of the lower long wall portions 133A.

The board support portion 123 has a similar shape to the board support portion 54 of the lower case 51 of the first embodiment and, though not illustrated in detail in the drawings, is provided, on the inner side, with a step portion including a step surface facing upward that supports the circuit board 20. The board support portion 123 is disposed around the entire periphery of the upper edge of the frame portion 121 except at a central position of the short frame portion 121B. Also, though not illustrated in detail in the drawings, in the four corners of the inner portion of the frame portion 121, screw holes and screw receiving portions for fixing the circuit board 20 are disposed. The circuit board 20 is housed inside the board support portion 123, placed on the step surface, and fixed to the screw receiving portions by the screws.

The frame portion 121 is housed inside the lower case 131, and the board support portion 123 is placed on the lower peripheral wall portion 133. The upper case 61 is placed over and attached to the lower case 131 and the spacer 120 from above, and the plurality of screws Sc are inserted into the corresponding screw insertion holes 65, 134 and screwed into the screw holes 122. In this way, the upper case 61, the lower case 131, and the spacer 120 are fixed together.

Other specific configurations are similar to that of the first embodiment, and the present modified example can achieve similar effects to that of the first embodiment.

Modified Example 2

Figure 15:
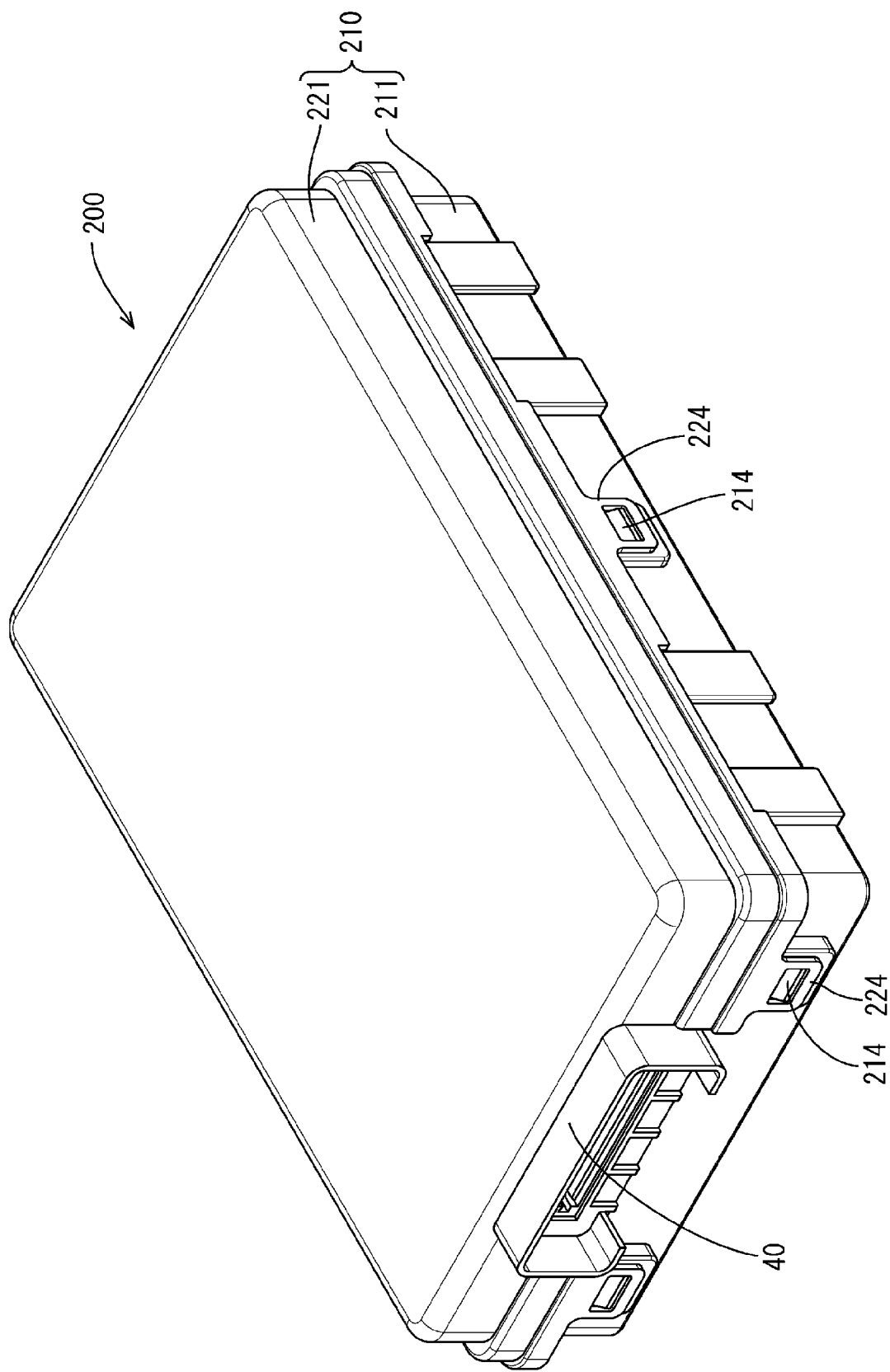
FIG. 15 is a perspective view of an electrical connection box of modified example 2.

Modified example 2 will be described with reference to FIGS. 15 and 16. An electrical connection box 200 of the present modified example is different from that of the first embodiment in that a casing 210 made of a synthetic resin is provided instead of the metal shield case 50. The synthetic resin casing 210 may be used in the case in which a shield is not required around the circuit board 20. Other configurations are similar to that of the embodiment, thus components similar to that of the embodiment are given the same reference sign and description thereof will be omitted.

The casing 210 includes a lower case 211 that internally houses the connector-attached board 10 and an upper case 221 that is attached to the lower case 211.

Figure 16:
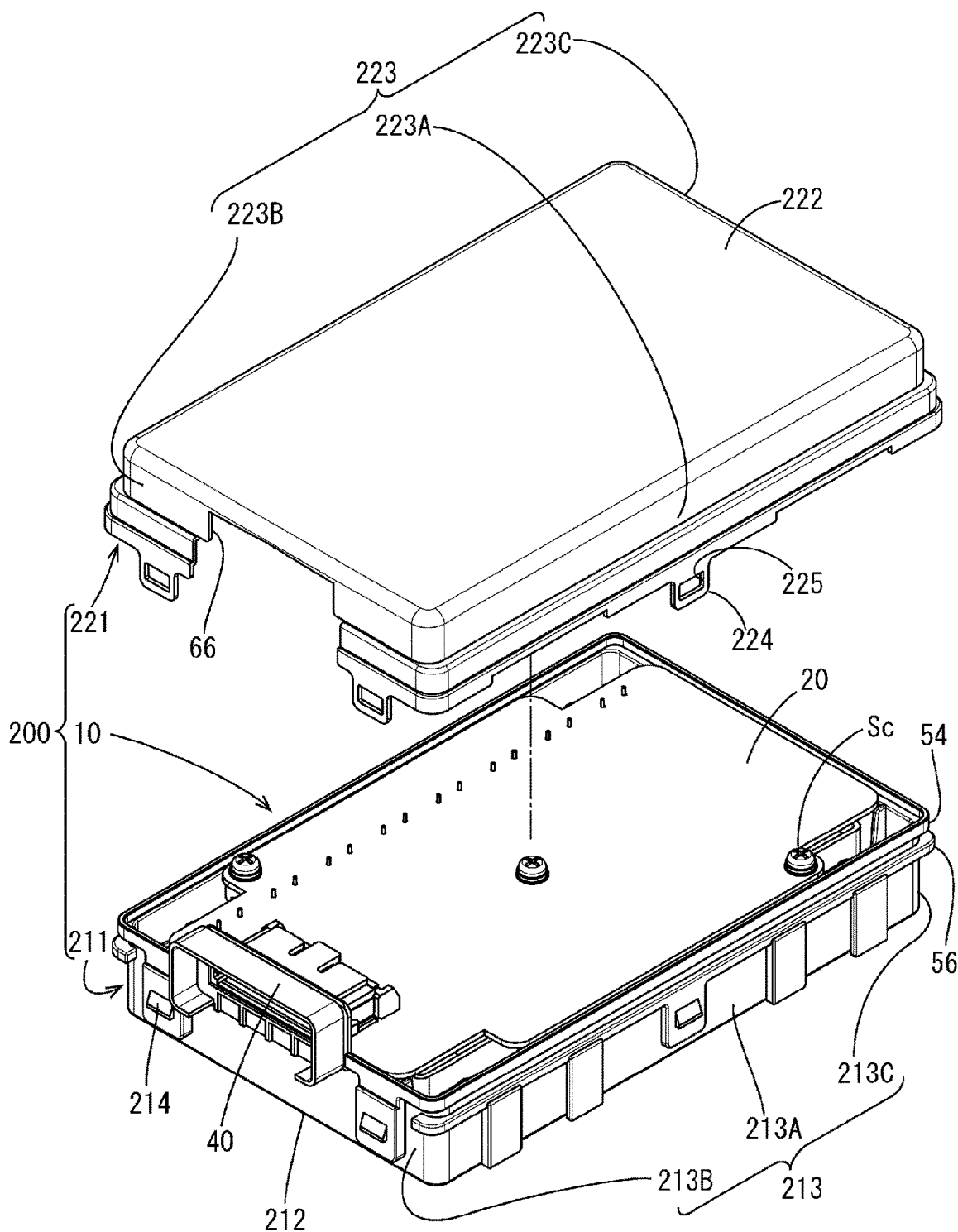
FIG. 16 is an exploded perspective view of the electrical connection box of modified example 2.

As illustrated in FIG. 16, the lower case 211 is a tray-like member with an open upper side. The lower case 211 is provided with a rectangular, plate-like case bottom wall 212, a lower peripheral wall portion 213 that is erected vertically from the peripheral edge of the case bottom wall 212, the board support portion 54 disposed on an upper edge of the lower peripheral wall portion 213, the pair of flange portions 56 projecting from the lower peripheral wall portion 213, and a plurality of locking projection portions 214.

The lower peripheral wall portion 213, as in the first embodiment, includes a pair of lower long wall portions 213A that are erected from the case bottom wall 212 and a pair of lower short wall portions 213B, 213C that are erected from the pair of short sides of the case bottom wall 212. The configuration of the board support portion 54 and the flange portions 56 are similar to that in the first embodiment. The locking projection portions 214 are projections for fixing the upper case 221 to the lower case 211 that project outward from the lower peripheral wall portion 213. Also, though not illustrated in detail in the drawings, inside the lower case 211, screw holes and screw receiving portions, into which the screws Sc are screwed to fixing the circuit board 20 are disposed.

The upper case 221 is, as in the first embodiment, a member for closing the opening portion of the lower case 211. The upper case 221 is provided with a rectangular, plate-like case top wall 222 slightly larger than the case bottom wall 212, an upper peripheral wall portion 223 that extends vertically downward from the peripheral edge of the case top wall 222, and a plurality of fixing pieces 224 that extend from the upper peripheral wall portion 223.

The upper peripheral wall portion 223 includes a pair of upper long wall portions 223A extending from the pair of long sides of the case top wall 222 and a pair of upper short wall portions 223B, 223C extending from the pair of short sides of the case top wall 222. The upper short wall portion 223B of the pair of upper short wall portions 223B, 223C includes the cutout portion 66, as in the first embodiment.

The fixing pieces 224 are plate-like portions that extend from the lower end of the upper peripheral wall portion 223 and each one includes a locking hole 225, capable of receiving the locking projection portion 214, at a position corresponding to the locking projection portions 214 of the lower case 211.

The connector-attached board 10 is, as in the first embodiment, housed inside the board support portion 54 and fixed to the screw receiving portions by the screws. The upper case 221 is placed over and attached to the lower case 211, with the upper peripheral wall portion 223 being placed on the flange portions 56, and the locking projection portions 214 are fitted into the locking holes 225 of the fixing pieces 224. In this way, the upper case 221 is fixed to the lower case 211.

Other configurations are similar to that of the first embodiment, and the present modified example can achieve similar effects to that of the first embodiment.

Second Embodiment

The second embodiment will be described with reference to FIGS. 17 to 28. In the present embodiment, components similar to that of the first embodiment are given the same reference sign and description thereof will be omitted.

Figure 17:
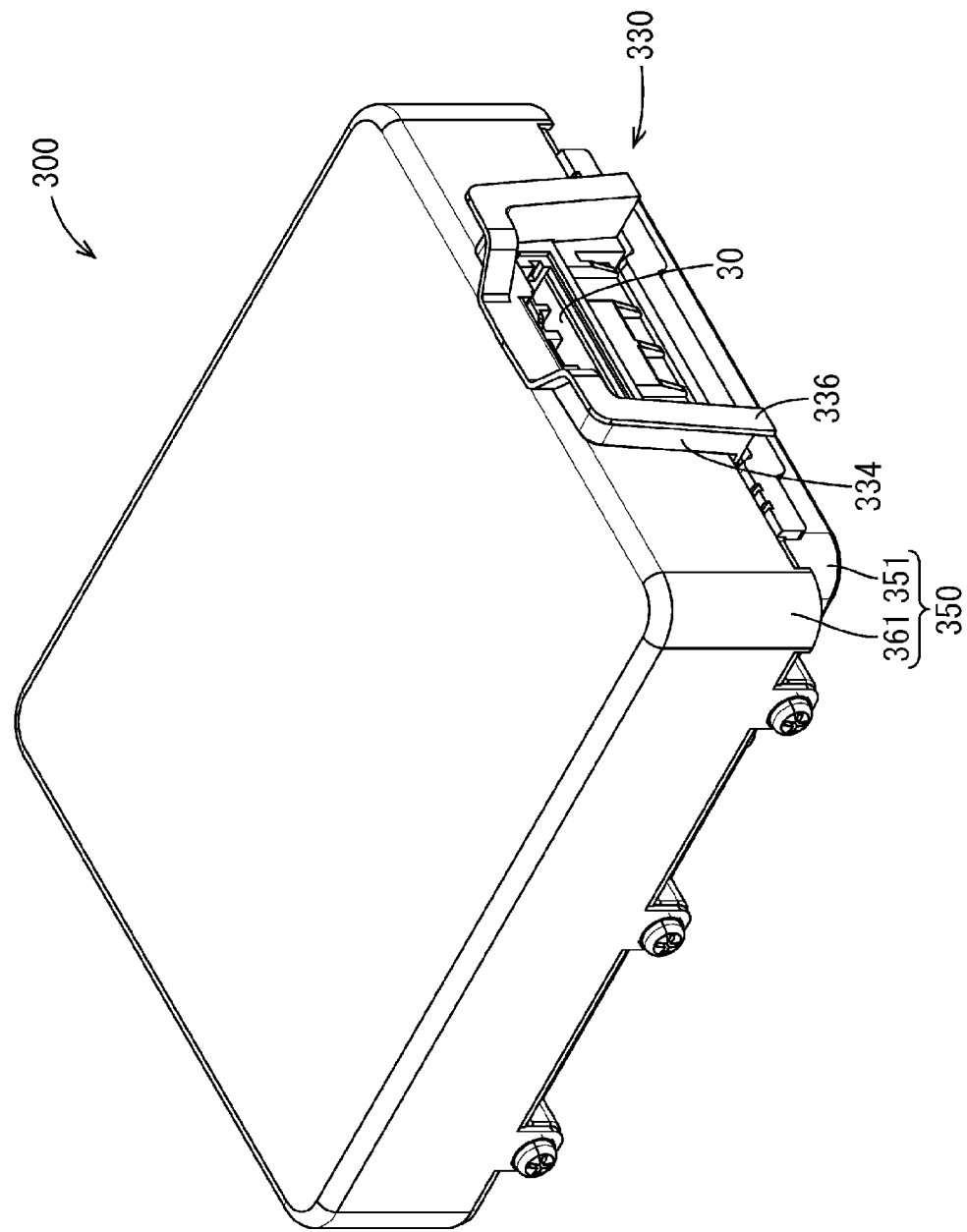
FIG. 17 is a perspective view of an electrical connection box of a second embodiment.
Figure 18:
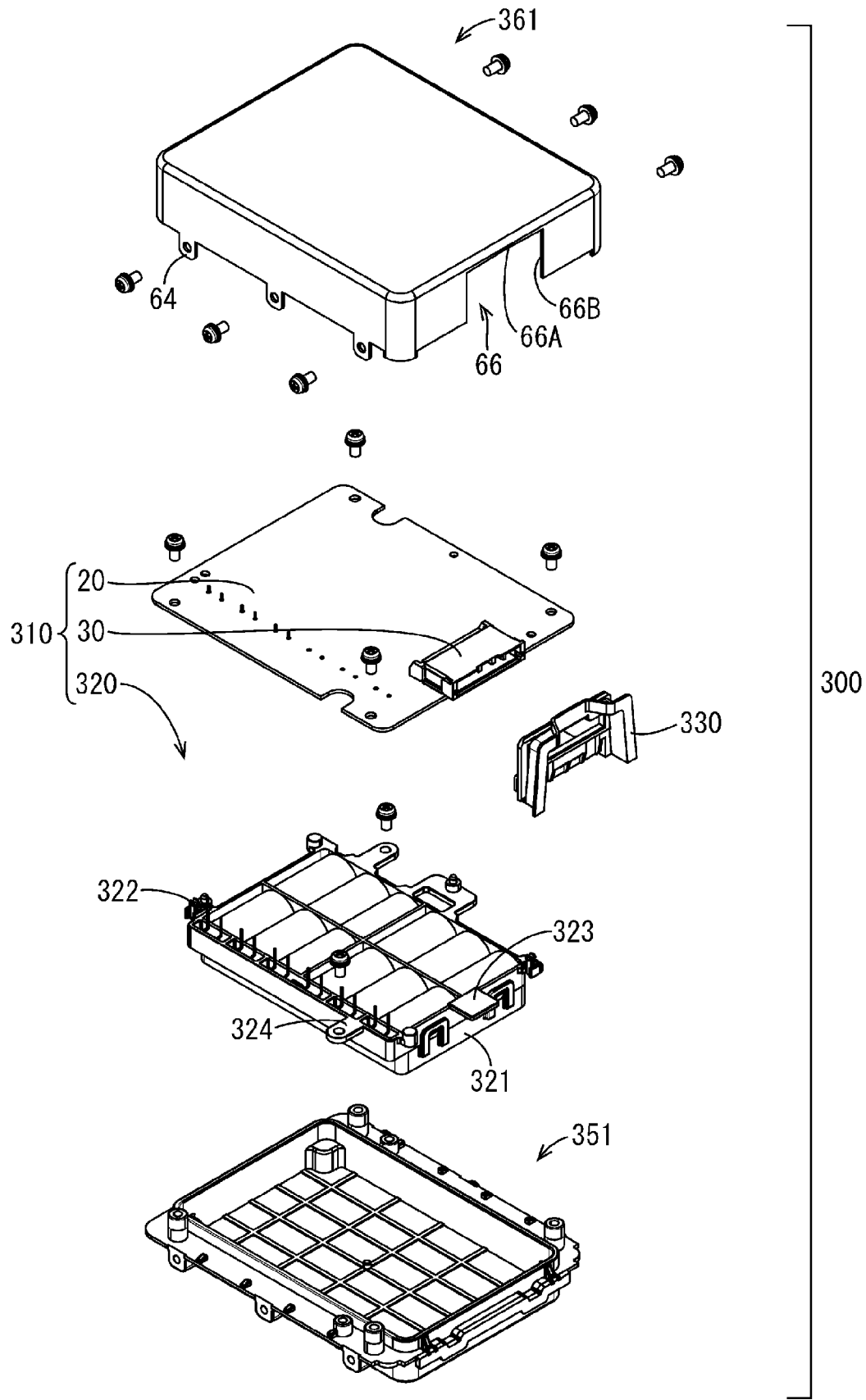
FIG. 18 is an exploded perspective view of the electrical connection box of the second embodiment.

As illustrated in FIGS. 17 and 18, an electrical connection box 300 is provided with a connector-attached board 310, an attachment 330 (corresponding to a waterproof member) that is attached to the connector attached board 310, and a shield case 350 (corresponding to a case) that internally houses the connector-attached board 310.

As illustrated in FIG. 18, the connector-attached board 310 is provided with the circuit board 20, the connector 30 fixed to the circuit board 20, and a frame 320 that is attached to the circuit board 20.

Figure 26:
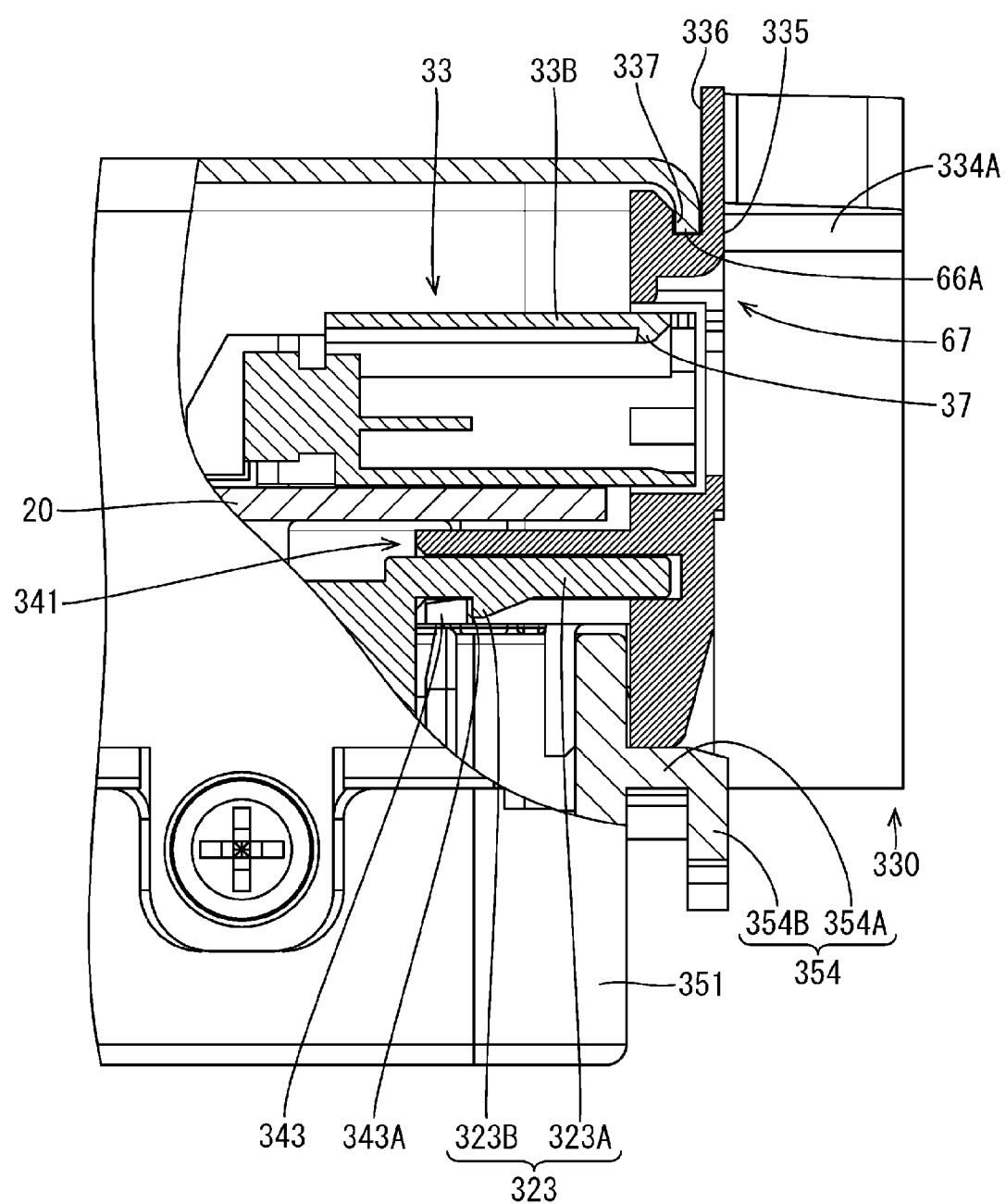
FIG. 26 is an enlarged cross-sectional view of a portion of the electrical connection box of the second embodiment taken along line A-A of FIG. 25.
Figure 27:
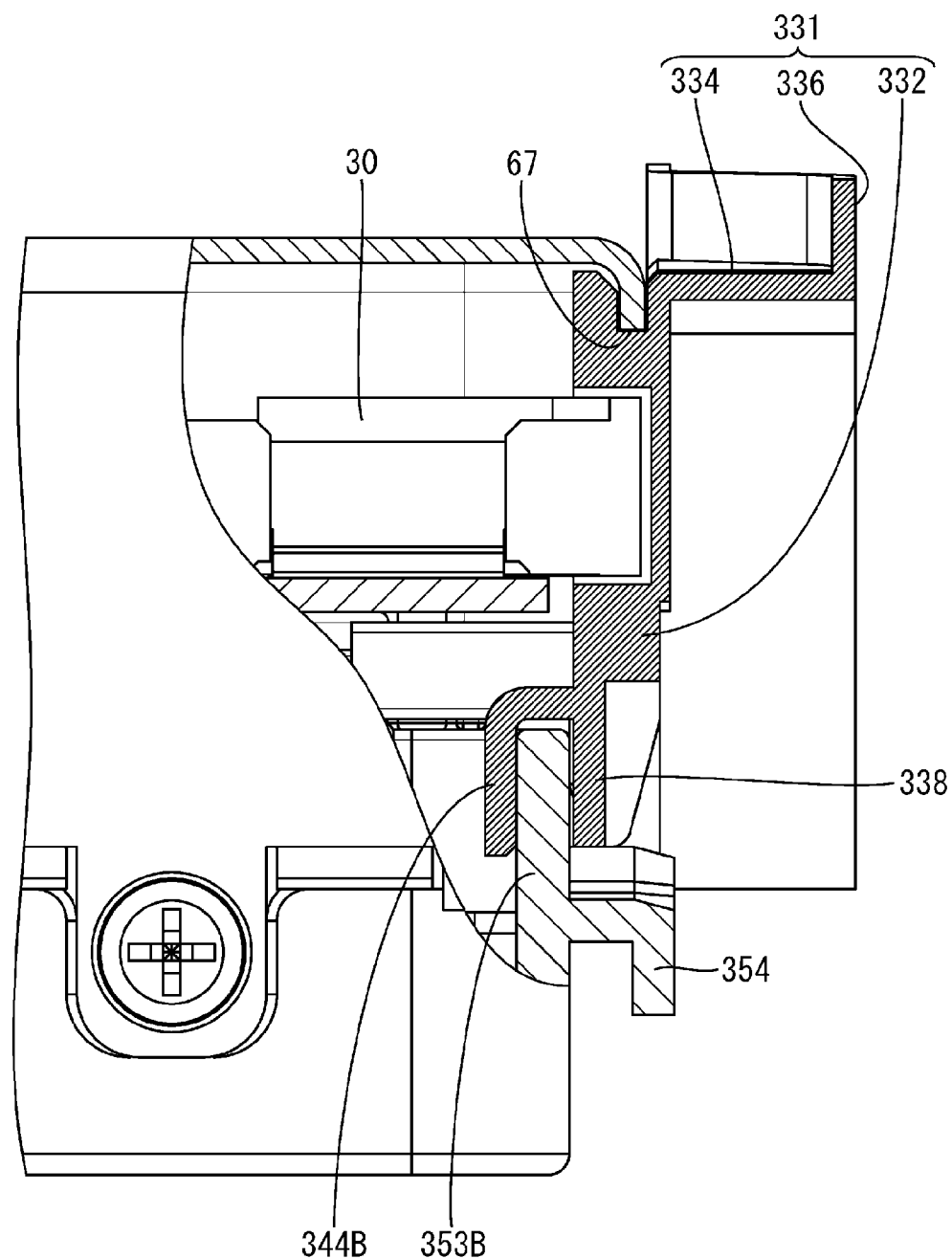
FIG. 27 is an enlarged cross-sectional view of a portion of the electrical connection box of the second embodiment taken along line B-B of FIG. 26.

The circuit board 20 has a similar configuration to that in the first embodiment. The connector 30 has a similar configuration to that in the first embodiment. As illustrated in FIG. 26, the connector housing 31 is provided with a lock receiving portion 37 that projects inside the hood portion 33 from the hood top wall 33B.

As illustrated in FIG. 18, the frame 320 is provided with a frame body 321, a plurality of board attachment portions 322 for attachment to the circuit board 20, a locking receiving portion 323 for attachment of the attachment 330, and a plurality of case attachment pieces 324 for fixing to the shield case 350.

As illustrated in FIG. 18, the frame body 321 has a rectangular, frame-like shape slightly smaller than the circuit board 20. The frame body 321 is disposed along the surface of the circuit board 20 on the opposite side to the mounting surface 21.

Though not illustrated in detail in the drawings, the plurality of board attachment portions 322 include a board engagement piece that is entered into a single frame locking hole of the circuit board 20 and engaged with the hole edge and press-in projections that are pressed into the other frame locking holes.

As illustrated in FIGS. 18 and 26, the locking receiving portion 323 has a plate-like shape extending from the frame body 321 and is provided with a locking receiving piece 323A disposed parallel with the circuit board 20 and a third locking catch 323B extending from the locking receiving piece 323A in the direction (downward in FIG. 26) opposite to the circuit board 20.

The plurality of case attachment pieces 324 extend outward from the frame body 321.

Figure 19:
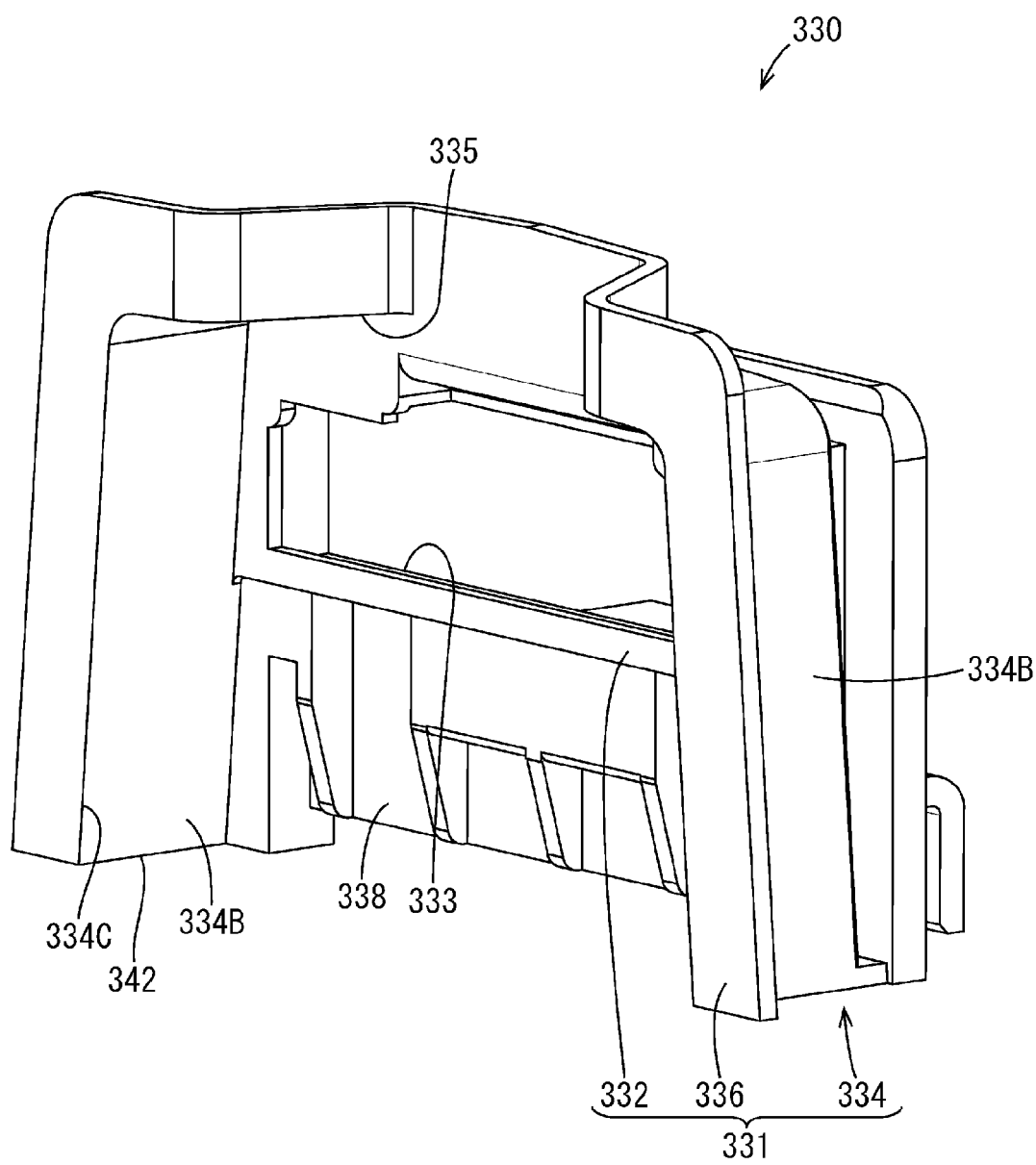
FIG. 19 is a perspective view of an attachment of the second embodiment.
Figure 20:
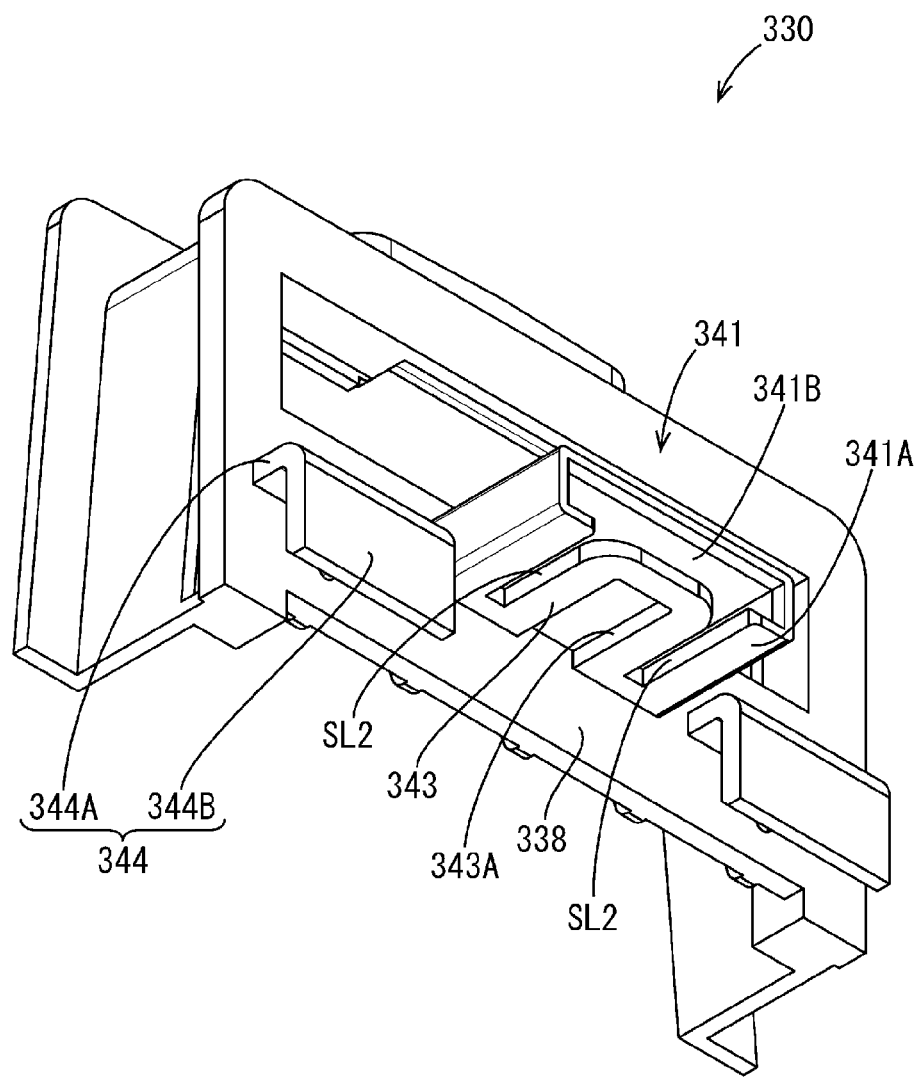
FIG. 20 is a perspective view of the attachment of the second embodiment as viewed from a different direction from FIG. 19.

As illustrated in FIGS. 19 and 20, the attachment 330 is provided with a connector support wall 332, a waterproof wall 334, an erect wall 336, a tilt prevention wall 338, a third locking portion 341 (corresponding a locking portion), and two fourth locking portions 344.

The connector support wall 332 is a thick, rectangular plate-like member. As illustrated in FIG. 19, the connector support wall 332 includes a through-hole (connector support hole 333) that extends through the connector support wall 332 in the plate thickness direction and into which the hood portion 33 of the connector 30 can be inserted.

Figure 21:
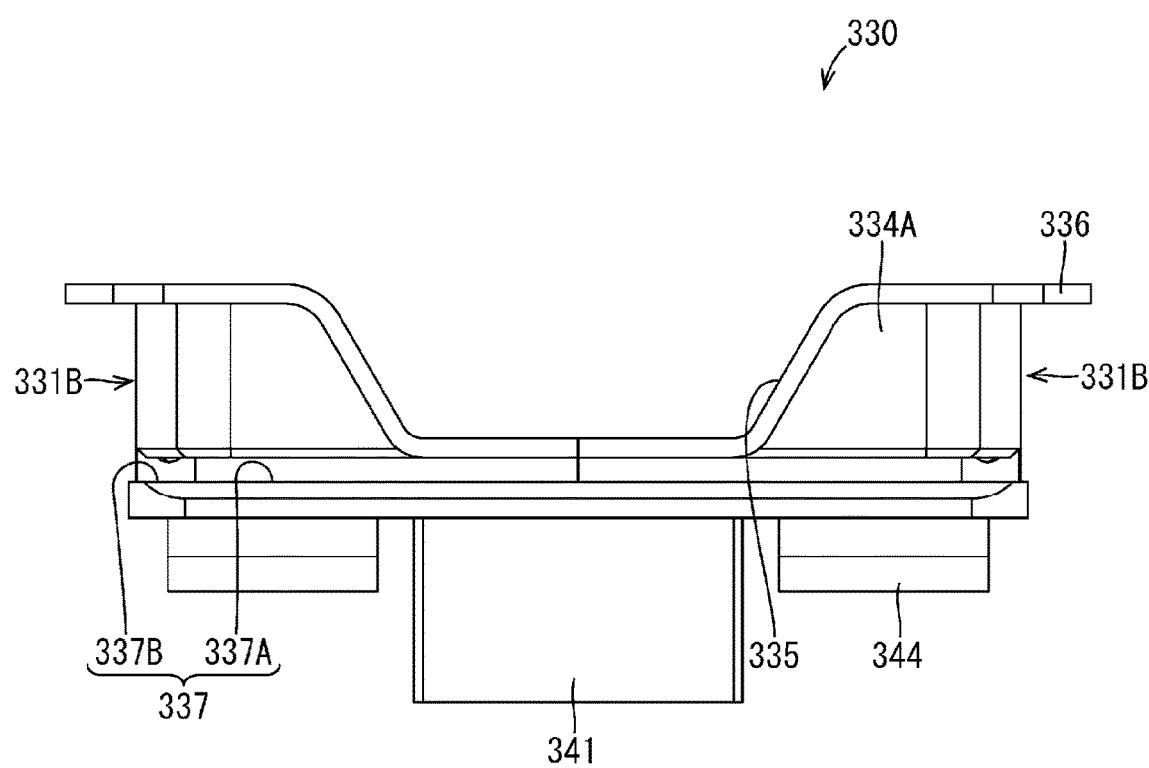
FIG. 21 is a top view of the attachment of the second embodiment.
Figure 22:
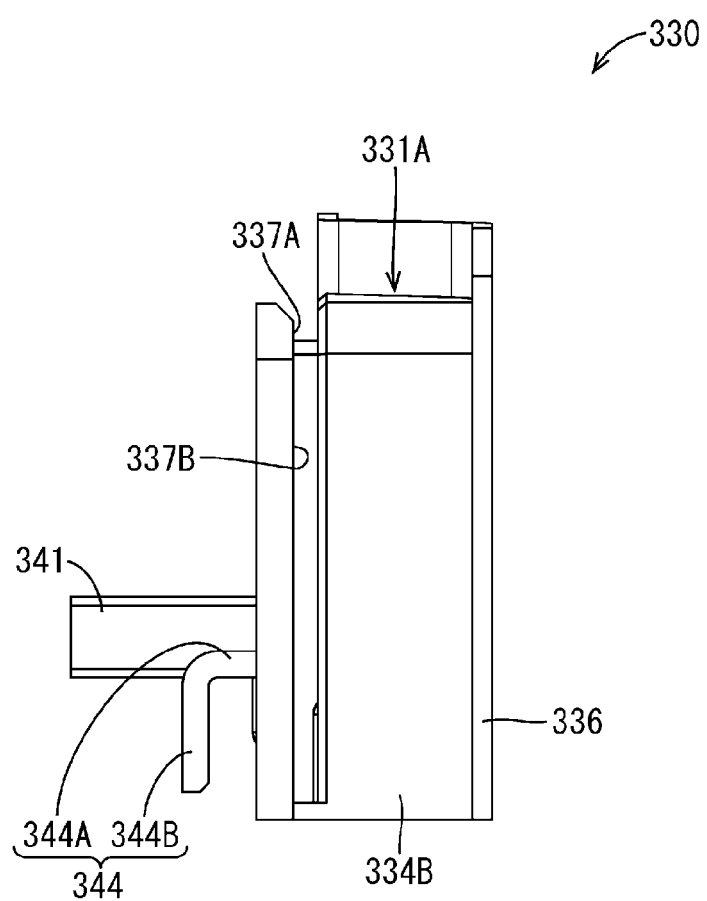
FIG. 22 is a side view of the attachment of the second embodiment.

As illustrated in FIG. 19, the waterproof wall 334 is a U-shaped wall perpendicularly extending from the peripheral edge of the connector support wall 332. As illustrated in FIGS. 19, 21, and 22, the waterproof wall 334 includes a waterproof upper wall 334A extending from the upper edge of the connector support wall 332 and two waterproof side walls 334B extending from the two side edges of the connector support wall 332. As illustrated in FIG. 19, the two waterproof side walls 334B extend far downward (the direction away from the waterproof upper wall 334A) further than the connector support wall 332. Also, the two waterproof side walls 334B are inclined, separating further from one another, i.e., the partner waterproof side wall 334B, the further they extend away from the waterproof upper wall 334A. As illustrated in FIG. 19, the waterproof wall 334 includes an opening portion (an insertion hole 334C) into which a mating connector 370 can be inserted on the opposite side to the connector support wall 332. The mating connector 370 can be inserted into the waterproof wall 334 from the insertion hole 334C.

As illustrated in FIGS. 19 and 21, the waterproof upper wall 334A includes a release recess portion 335. The release recess portion 335 is a recess portion recessed from the opening edge of the insertion hole 334C toward the connector support wall 332 and is disposed at a central position between the two waterproof side walls 334B.

As illustrated in FIG. 19, the erect wall 336 is a wall extending outward from the opening edge of the insertion hole 334C and the inner edge of the release recess portion 335 perpendicular to the waterproof wall 334. The erect wall 336 is disposed along the entire length of the waterproof wall 334.

As illustrated in FIG. 19, the tilt prevention wall 338 is a wall that extends downward from the connector support wall 332 and is disposed across the entire width of the lower surface of the connector support wall 332 and connected to the waterproof side walls 334B.

The connector support wall 332, the waterproof wall 334, and the erect wall 336 form a waterproof portion 331 for preventing water from entering inside the shield case 350 and the connector 30. As illustrated in FIG. 19, below the connector support wall 332, in other words, the space surrounded by the two waterproof side walls 334B and the tilt prevention wall 338, is an escape portion 342 (corresponding to the non-covered portion) where the portion covering the connector 30 or the mating connector 370 is not disposed. The escape portion 342 is a space that gives freedom to the fingers of a worker to engage the mating connector 370 with the connector 30.

As illustrated in FIGS. 21 and 22, the waterproof portion 331 includes an engagement groove 337 in an upper surface (a waterproof upper surface 331A) and in a pair of side surfaces (waterproof side surfaces 331B) of the outer peripheral surface of the waterproof wall 334. The portion of the engagement groove 337 located in the waterproof upper surface 331A is an upper groove portion 337A, and the portions of the engagement groove 337 located in the two waterproof side surfaces 331B are side groove portions 337B. As illustrated in FIG. 22, the lower ends of the side groove portions 337B are located down near the lower ends of the waterproof side surfaces 331B.

As illustrated in FIG. 20, the third locking portion 341 is a rectangular prism-like portion extending in the opposite direction to the waterproof wall 334 from the tilt prevention wall 338 and is capable of receiving inside the locking receiving portion 323. The third locking portion 341 is provided with a first parallel wall 341A and a second parallel wall 341B that are parallel with the locking receiving portion 323. The first parallel wall 341A is provided with two slits SL2 extending from the extending end toward the tilt prevention wall 338. The portion between the two slits SL2 is a third bending piece 343 that is capable of bending, the base end thereof being the portion connected to the connector support wall 332. The third bending piece 343 includes a locking hole 343A capable of receiving the third locking catch 323B.

As illustrated in FIGS. 20 and 22, the two fourth locking portions 344 has an L-shape and are each provided with a base wall 344A perpendicularly extending from the tilt prevention wall 338 and a clamping wall 344B extending from the extending end of the base wall 344A parallel with the tilt prevention wall 338. A gap is formed between the tilt prevention wall 338 and the clamping wall 344B.

As illustrated in FIG. 17, the shield case 350 is made of metal and includes a lower case 351 and an upper case 361 that is attached to the lower case 351.

Figure 23:
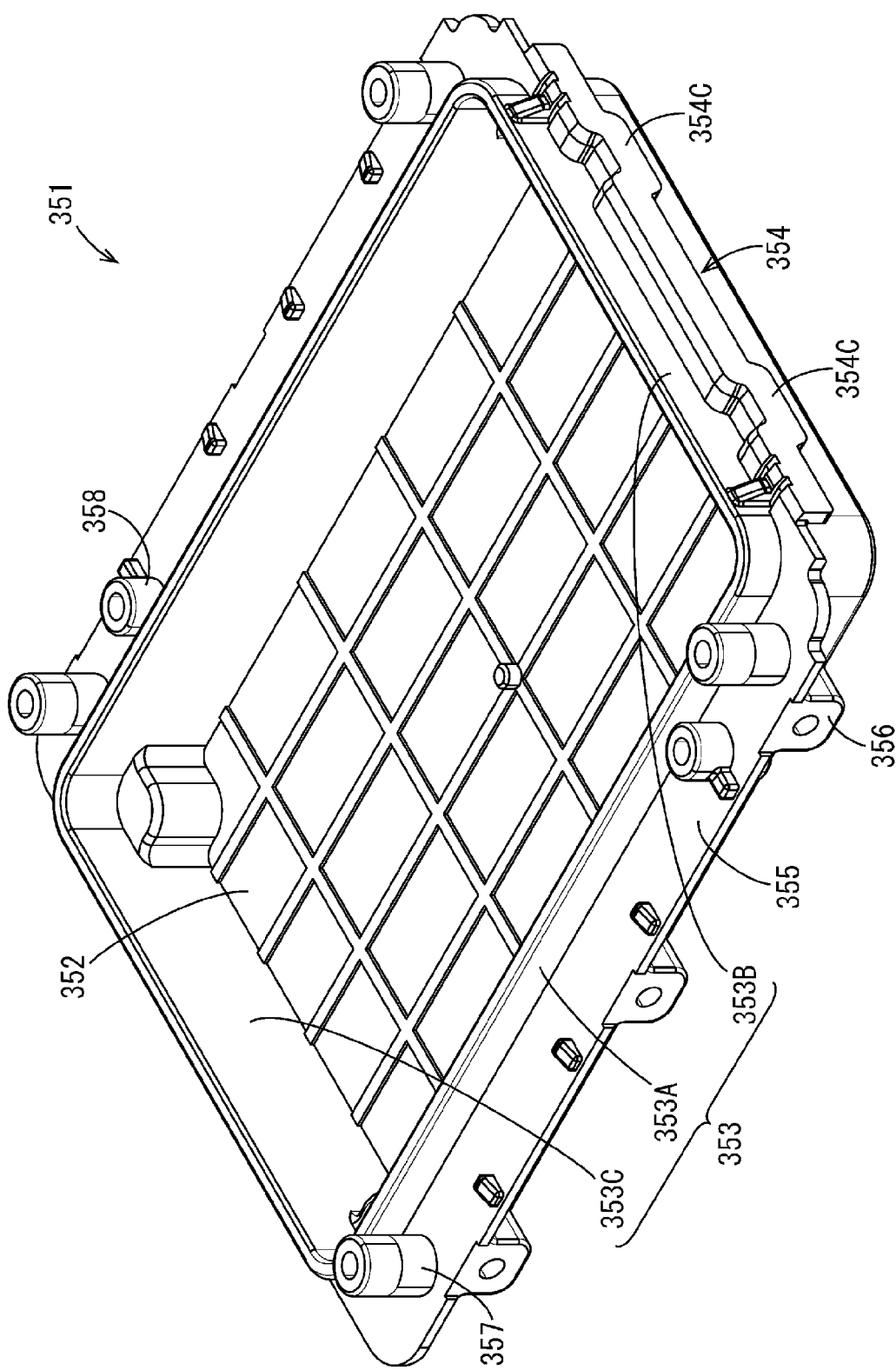
FIG. 23 is a perspective view of a lower case of the second embodiment.

The lower case 351 is manufactured by die casting and is a tray-like member with an open upper side. As illustrated in FIG. 23, the lower case 351 is provided with a rectangular, plate-like case bottom wall 352, a lower peripheral wall portion 353 that is erected vertically from the peripheral edge of the case bottom wall 352, a support wall 354 and a flange portion 355 projecting from the lower peripheral wall portion 353, a plurality of base portions 356 extending from the flange portion 355, and a plurality of first boss portions 357 and second boss portions 358.

As illustrated in FIG. 23, the lower peripheral wall portion 353 includes a pair of lower long wall portions 353A that are erected from the pair of long sides of the case bottom wall 352 and a pair of lower short wall portions 353B, 353C that are erected from the pair of short sides of the case bottom wall 352. The frame 320 can be housed inside the lower peripheral wall portion 353.

Figure 24:
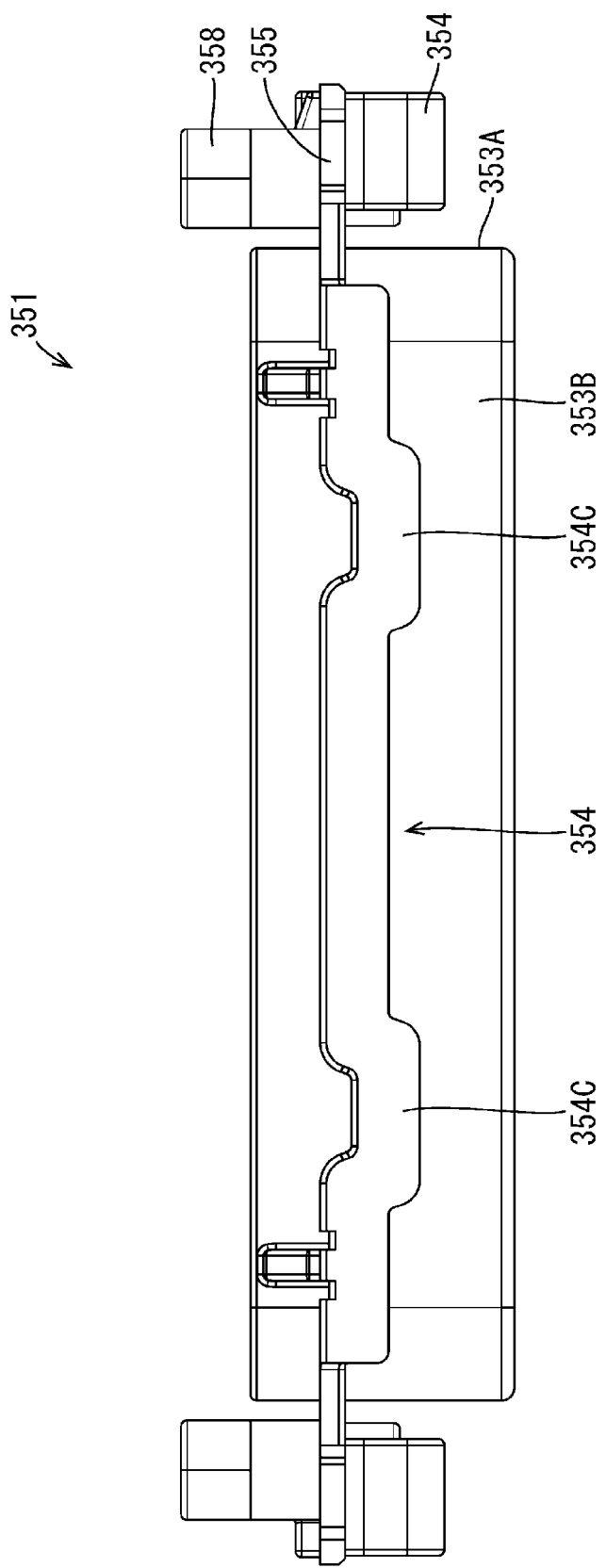
FIG. 24 is a front view of the lower case of the second embodiment.

As illustrated in FIG. 26, the support wall 354 is provided with a lateral wall portion 354A that projects outward from the lower short wall portion 353B and a vertical wall portion 354B that extends downward from the projecting end of the lateral wall portion 354A. Also, as illustrated in FIGS. 23 and 24, the support wall 354 extends across substantially the entire width of the lower short wall portion 353B. The support wall 354 is provided at two positions with a receiving recess portion 354C with a U-shape that projects toward the case bottom wall 352.

As illustrated in FIGS. 23 and 24, the flange portion 355 is a flange-like portion that projects outward from the pair of lower long wall portions 353A and the lower short wall portion 353C.

The base portions 356 are portions into which screws for screwing in the upper case 361 are screwed into. As illustrated in FIGS. 23 and 24, three of the base portions 356 are disposed along each lower long wall portion 353A under the flange portion 355. The first boss portions 357 are cylindrical projection portions for screwing in the circuit board 20. As illustrated in FIG. 23, four of the first boss portions 357 are disposed surrounding the lower peripheral wall portion 353. The second boss portions 358 are cylindrical projection portions for screwing in the frame 320. As illustrated in FIG. 23, one of the second boss portions 358 is disposed on the outside of each of the two lower long wall portions 353A. The base portions 356, the first boss portions 357, and the second boss portions 358 all include a screw hole.

As illustrated in FIGS. 17 and 18, the upper case 361 is a member for closing the opening portion of the lower case 351. The configuration of the upper case 361 is similar to that of the first embodiment except for details such as the number of fixing pieces 64. Thus, components similar to that of the first embodiment are given the same reference sign and description thereof will be omitted.

An example of a process of manufacturing the electrical connection box 300 will be described below.

First, as in the first embodiment, the connector 30 is fixed to the circuit board 20.

Next, the frame 320 is attached to the circuit board 20. The frame 320 is disposed aligned with the surface of the circuit board 20 on the opposite side to the mounting surface 21, and the board engagement piece enters the corresponding frame locking hole and engages with the hole edge. Also, the press-in projections are pressed in the corresponding frame locking holes. In this way, the assembly of the circuit board 20 and the frame 320 is completed, and the connector-attached board 310 is obtained.

Next, the attachment 330 is attached to the connector-attached board 310. The leading end portion of the hood portion 33 is inserted into the connector support hole 333 (see FIG. 26). Also, the locking receiving portion 323 is inserted inside the third locking portion 341 (see FIG. 26). The third bending piece 343 runs up onto the third locking catch 323B and bends outward, the third bending piece 343 elastically returns when the third locking catch 323B enters the locking hole 343A, and the third locking catch 323B engages with the hole edge of the locking hole 343A. In this way, the attachment of the attachment 330 to the connector-attached board 310 is completed.

Because the attachment 330 is engaged with the third bending piece 343 provided on the frame 320 and not the connector 30, compared to an example in which the attachment is engaged with the connector, the stress on the connector 30 from attaching the attachment 330 is reduced and the join portion between the connector 30 and the circuit board 20 is prevented from peeling. With the attachment 330 attached to the connector-attached board 310, the waterproof upper wall 334A including the release recess portion 335 is disposed on the same side (the upper side in FIG. 26) as the lock receiving portion 37 with respect to the connector 30.

Next, the lower case 351 is attached to the connector-attached board 310 with the attachment 330 attached. The frame 320 is housed inside the lower case 351, the circuit board 20 is placed on the four first boss portions 357, and the board attachment portions 322 are placed on the corresponding second boss portions 358. In this state, the circuit board 20 is fixed to the first boss portions 357 by a screw, and the board attachment portions 322 are fixed to the second boss portions 358 by screws. In this way, the attachment of the lower case 351 to the connector-attached board 310 is completed.

Figure 25:
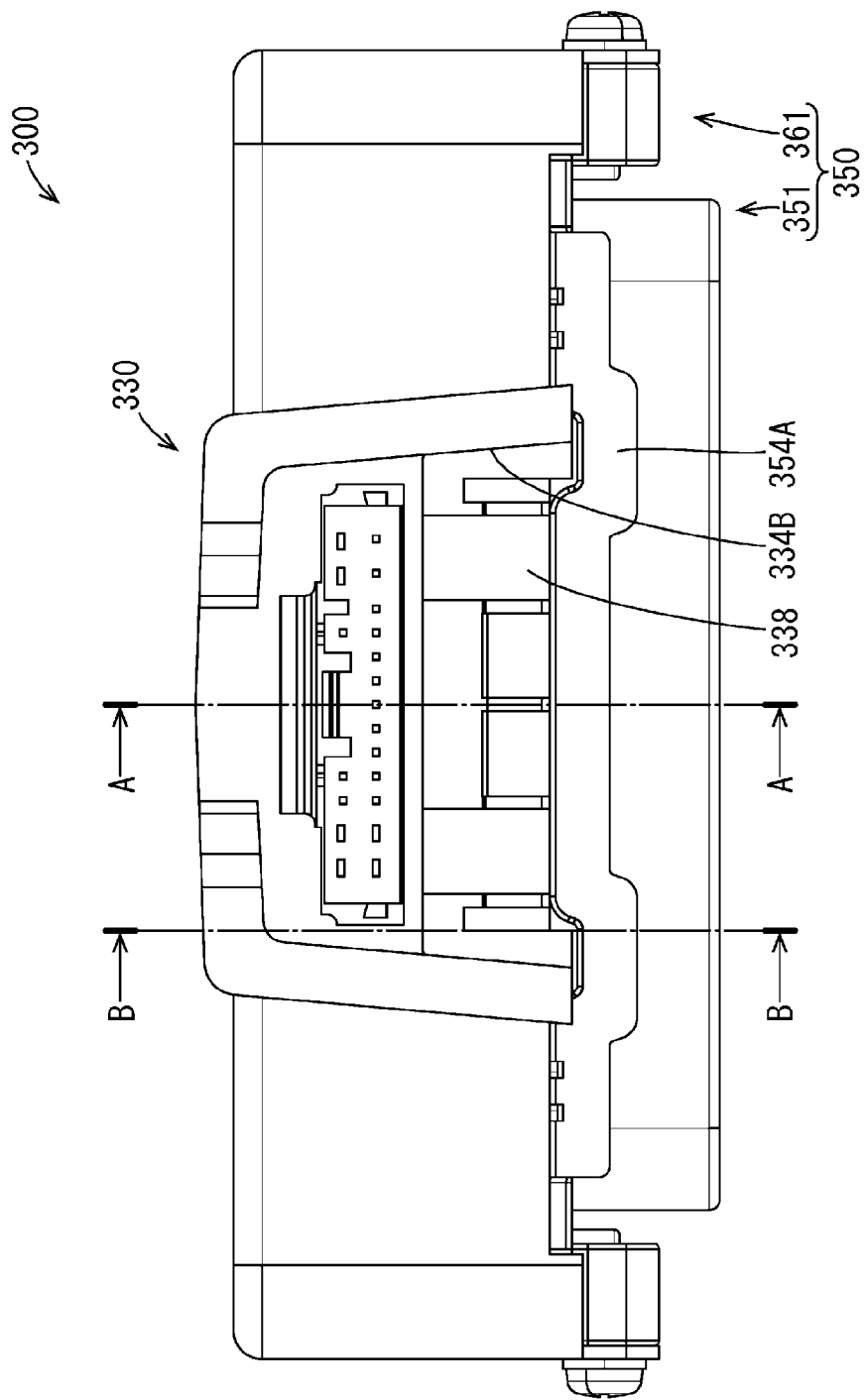
FIG. 25 is a front view of the electrical connection box of the second embodiment.

With the lower case 351 attached to the connector-attached board 310, the corner portions formed by the tilt prevention wall 338 and the lower end portions of the two waterproof side walls 334B fit inside the two receiving recess portion 354C (see FIG. 25). Also, a gap the thickness of the lower short wall portion 353B is formed between the clamping wall 344B and the tilt prevention wall 338. In this gap, the portion of the lower short wall portion 353B positioned further upward than the support wall 354 is inserted (see FIG. 27). The tilt prevention wall 338 is disposed along the outer surface of the lower short wall portion 353B, and the clamping wall 344B is disposed along the inner surface of the lower short wall portion 353B. In the case in which the attachment 330 tilts with respect to the circuit board 20, the tilt is restricted by the tilt prevention wall 338 and the clamping wall 344B coming into contact with the lower short wall portion 353B. In this way, the attachment 330 together with the connector 30 tilting and the connector 30 peeling off from the circuit board 20 can be reliably prevented.

Next, the upper case 361 is attached to the lower case 351. The upper case 361 is placed over and attached to the lower case 351 from above (see FIG. 25). The upper end portion (portion further upward than the flange portion 355) of the lower peripheral wall portion 353 and the circuit board 20 supported on the lower case 351 are housed inside the upper case 361. Also, as in the first embodiment, the peripheral portion of the cutout edge of the cutout portion 66 (the rear edge 66A and the side edges 66B) of the upper case 361 fits into the engagement groove 337 (see FIG. 26). In this state, the fixing pieces 64 are fixed to the corresponding base portions 356 by screws. In this way, the attachment of the upper case 361 to the lower case 351 is completed.

As in the first embodiment, with the lower case 351 and the upper case 361 fixed to one another, the opening portion defined by the rear edge 66A, the side edges 66B, and the upper edge of the lower peripheral wall portion 353 form the connector opening 67. The waterproof portion 331 (the connector support wall 332, the waterproof wall 334, and the erect wall 336) projects outward from the connector opening 67 and the hood portion 33 faces out through the connector opening 67 (see FIGS. 26 and 27).

Figure 28:
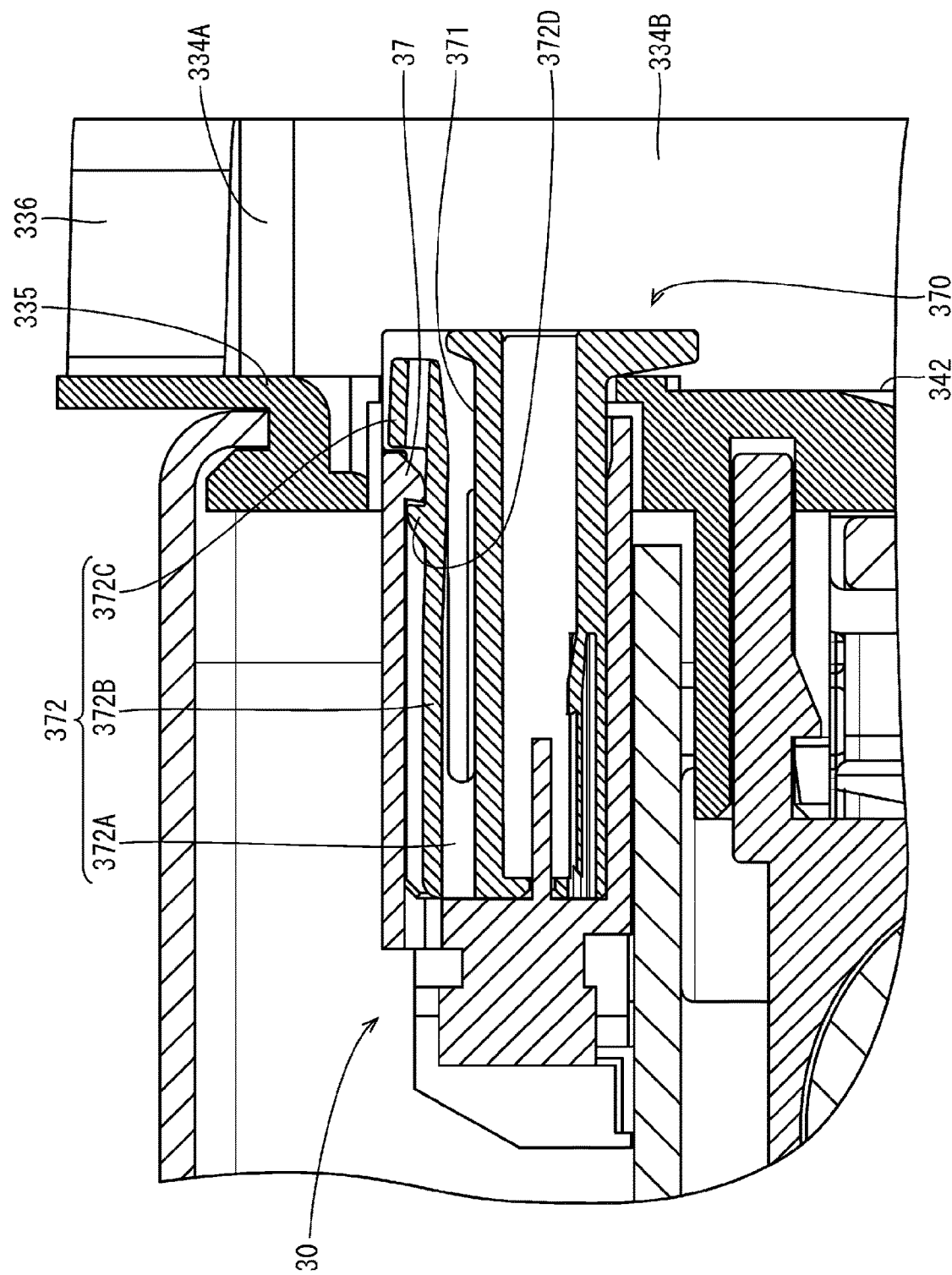
FIG. 28 is an enlarged cross-sectional view of the electrical connection box of the second embodiment with a mating connector engaged with a connector taken along the same position as line A-A of FIG. 25.

As illustrated in FIG. 28, the mating connector 370 engaged with the connector 30 is provided with a mating housing 371 and a lock arm 372 (corresponding to a lock portion) disposed on the upper surface of the mating housing 371. The lock arm 372 is provided with a leg portion 372A that rises upward from the upper surface of the mating housing 371, a plate-like arm body 372B that extends cantilevered from the upper end of the leg portion 372A, and a release operation portion 372C that extends from the extending end of the arm body 372B. A lock projection 372D is disposed on the upper surface of the arm body 372B that projects upward and engages with the lock receiving portion 37 of the connector housing 31. The lock arm 372 is capable of elastically bending in a direction toward or away from the mating housing 371, with the leg portion 372A acting as the fulcrum.

When the connector 30 and the mating connector 370 are engaged, the mating connector 370 enters inside the waterproof wall 334 and enters inside the hood portion 33. When the mating connector 370 is pushed inside the hood portion 33, the lock projection 372D and the lock receiving portion 37 interfere, bending the lock projection 372D in the direction toward the mating housing 371. Then, when the mating connector 370 is pushed to an established engagement position, the lock projection 372D gets over the lock receiving portion 37, the lock arm 372 elastically returns, and the lock projection 372D engages with the lock receiving portion 37. In this way, the mating connector 370 is held locked in the connector 30.

With the connector 30 and the mating connector 370 engaged with one another, the waterproof wall 334 covers the mating connector 370 from above and both sides. Thus, water from above or the sides is prevented from entering inside from the engagement portion between the connector 30 and the mating connector 370.

Also, because the erect wall 336 extends from the waterproof wall 334, water adhered to the waterproof wall 334 is prevented from entering inside the waterproof wall 334 from the insertion hole 334C side and entering inside from the engagement portion of the connector 30 and the mating connector 370.

When the mating connector 370 is detached from the connector 30, the release operation portion 372C is operated and pushed in the direction toward the mating housing 371. Here, as illustrated in FIG. 28, with the connector 30 and the mating connector 370 engaged with one another, the lock arm 372 is disposed on the surface of the mating housing 371 opposite the waterproof upper wall 334A, and the leading end portion of the release operation portion 372C is exposed outside from the release recess portion 335. In this manner, the leading end portion of the release operation portion 372C is covered by the waterproof wall 334. Thus, the worker can insert a finger inside the release recess portion 335 can easily push and operate the release operation portion 372C. With this push operation, the lock arm 372 is elastically bent and the engagement of the lock projection 372D with the lock receiving portion 37 is released. In this state, the mating connector 370 can be pulling in the direction away from the connector 30 (right direction in FIG. 28) to remove the mating connector 370 from the connector 30.

Also, in the attachment 330, the space below the mating connector 370 is the escape portion 342 where the waterproof wall 334 is not disposed. The escape portion 342 gives freedom to fingers to engage the mating connector 370 with the connector 30. This allows this engagement and removal operation to be easily performed.

According to the present embodiment, as in the first embodiment, the attachment 330, formed as a separate member, is attached to the connector-attached board 310. Thus, there is no need to develop a dedicated connector with a waterproof structure, and waterproofing can be achieved simply and at a low cost.

In addition, the attachment 330 is provided with the clamping wall 344B that is disposed with a gap between it and the tilt prevention wall 338, and the lower short wall portion 353B is disposed in this gap.

According to this configuration, the attachment 330 together with the connector 30 tilting and the connector 30 peeling off from the circuit board 20 can be reliably prevented by restricting the tilting of the attachment 330 via the tilt prevention wall 338 and the clamping wall 344B.

Also, the waterproof wall 334 includes the insertion hole 334C into which the mating connector 370 is inserted, and the attachment 330 is provided with the erect wall 336 that rises outward from the opening edge of the insertion hole 334C. According to this configuration, water adhered to the waterproof wall 334 is prevented from entering inside the waterproof wall 334 and entering inside from the engagement portion of the connector 30 and the mating connector 370.

Furthermore, the connector-attached board 310 is provided with the frame 320 that is attached to the circuit board 20, the attachment 330 is provided with the third locking portion 341, and the frame 320 is provided with the locking receiving portion 323 that engages with the third locking portion 341.

According to this configuration, the attachment 330 is engaged with the frame 320. Thus, compared to an example in which the attachment is engaged with the connector, the stress on the connector 30 from attaching the attachment 330 is reduced and the join portion between the connector 30 and the circuit board 20 is prevented from peeling.

Also, the connector 30 is provided with the lock receiving portion 37 capable to engaging with the lock arm 372 provided on the mating connector 370, and the waterproof wall 334 is provided with the release recess portion 335 on the same side as the lock receiving portion 37 with respect to the connector 30, the release recess portion 335 exposing to the outside at least a portion of the lock arm 372 when the connector 30 is in an engaged state with the mating connector 370.

According to this configuration, to remove the mating connector 370 from the connector 30, a simple operation is performed in which the worker puts a finger inside the release recess portion 335 and releases the engagement of the lock arm 372 with the lock receiving portion 37.

OTHER EMBODIMENTS

The technology disclosed in the present specification is not limited to the embodiments described above with reference to the drawings, and, for example, the following embodiments are also included.

The waterproof member is provided with a waterproof portion covering a periphery of an engagement surface of the connector facing the mating connector" includes in its meaning, as in the first and second embodiments, the engagement surface 33DF being located inside the connector support hole 43, 333 of the waterproof portion 41, 331 (the periphery of the engagement surface 33DF being covered by the connector support wall 42, 332) and a portion of the connector facing inside the waterproof wall and the periphery of the engagement surface being covered by the waterproof wall. In the latter case, the waterproof wall covers the portion of the connector disposed inside the waterproof wall and the mating connector.

In the second embodiment, the erect wall 336 is disposed across the entire length of the waterproof wall 334. However, the certain effect can be achieved as along as the erect wall is disposed at at least a portion of the waterproof wall.

In the second embodiment, the locking portion is the third bending piece 343 including the locking hole 343A, and the locking receiving portion 323 is provided with the locking receiving piece 323A and the third locking catch 323B. However, the engagement structure of the waterproof member and the frame is not particularly limited. For example, the locking portion may be provided with a locking catch, the locking receiving portion may be provided with a locking hole for receiving the locking catch, and a locking catch may be provided that engages together the locking portion and the locking receiving portion.

What is claimed is:

1. An electrical connection box, comprising:
   a connector-attached board provided with a circuit board and a connector fixed to the circuit board that engages with a mating connector;
   a waterproof member attached to the connector-attached board; and
   a case that internally houses the connector-attached board, wherein the case includes:
   a case top wall; and
   a case side wall that extends vertically from the case top wall, surrounds the circuit board, and has an opening portion formed on a bottom edge of the case side wall and configured to receive the waterproof member, wherein the waterproof member includes an engagement groove configured to receive a portion of the case side wall, and wherein the connector extends through the opening portion and is exposed to the outside of the case,
   the waterproof member is provided with a waterproof portion covering a periphery of an engagement surface of the connector facing the mating connector, and the waterproof portion is provided with a waterproof wall covering a periphery of the connector or the mating connector,
   the waterproof wall has an insertion opening into which the mating connector is inserted, and
   the waterproof member is provided with an erect wall that extends outward from an opening edge of the insertion opening with respect to the waterproof wall, and the erect wall is spaced apart from the case side wall and projects outward beyond the case top wall.

2. The electrical connection box according to claim 1, wherein the waterproof wall projects outside the case through the opening portion.

3. The electrical connection box according to claim 2, wherein the waterproof wall is provided with a waterproof upper wall covering an upper portion of the connector or the mating connector that engages with the connector, and a waterproof side wall that extends downward from the waterproof upper wall and covers a side of the connector or the mating connector.

4. The electrical connection box according to claim 2, wherein the connector is fixed to an upper surface of the circuit board, and the waterproof member is provided with a tilt prevention wall that extends from the waterproof portion downward below the circuit board and is disposed along the case side wall.

5. The electrical connection box according to claim 1, wherein the waterproof wall is provided with a waterproof upper wall covering an upper portion of the connector or the mating connector that engages with the connector, and a waterproof side wall that extends downward from the waterproof upper wall and covers a side of the connector or the mating connector.

6. The electrical connection box according to claim 5, wherein the connector is fixed to an upper surface of the circuit board, and the waterproof member is provided with a tilt prevention wall that extends from the waterproof portion downward below the circuit board and is disposed along the case side wall.

7. The electrical connection box according to claim 1, wherein the connector is fixed to an upper surface of the circuit board, and the waterproof member is provided with a tilt prevention wall that extends from the waterproof portion downward below the circuit board and is disposed along the case side wall.

8. The electrical connection box according to claim 7, wherein the waterproof member is provided with a clamping wall disposed with a gap between the clamping wall and the tilt prevention wall, and the case side wall is disposed in the gap.

\* \* \* \* \*